US006771199B2

(12) United States Patent
Brooks et al.

(10) Patent No.: US 6,771,199 B2
(45) Date of Patent: Aug. 3, 2004

(54) METHOD AND APPARATUS FOR MISMATCHED SHAPING OF AN OVERSAMPLED CONVERTER

(75) Inventors: Todd L. Brooks, Laguna Beach, CA (US); David S. P. Ho, Singapore (SG); Kevin L. Miller, Lawrenceville, GA (US); Eric Fogleman, La Jolla, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/408,446

(22) Filed: Apr. 8, 2003

(65) Prior Publication Data

US 2004/0021596 A1 Feb. 5, 2004

Related U.S. Application Data

(63) Continuation of application No. 09/949,807, filed on Sep. 12, 2001, now Pat. No. 6,628,218, and a continuation of application No. 09/949,815, filed on Sep. 12, 2001, now Pat. No. 6,577,261.
(60) Provisional application No. 60/231,991, filed on Sep. 11, 2000, and provisional application No. 60/232,155, filed on Sep. 11, 2000.

(51) Int. Cl.[7] .............................................. H03M 1/66
(52) U.S. Cl. ...................................... 341/143; 341/118
(58) Field of Search ............................... 341/143, 150, 341/118, 141

(56) References Cited

U.S. PATENT DOCUMENTS

| 5,055,846 A | 10/1991 | Welland ..................... 341/155 |
| 5,138,317 A | 8/1992 | Story ......................... 341/144 |
| 5,221,926 A | 6/1993 | Jackson ...................... 341/118 |
| 5,323,157 A | 6/1994 | Ledzius et al. ............ 341/143 |
| 5,404,142 A | 4/1995 | Adams et al. ............. 341/144 |
| 5,406,283 A | 4/1995 | Leung ........................ 341/143 |
| 5,684,482 A | 11/1997 | Galton ....................... 341/144 |
| 5,706,308 A | 1/1998 | Ichimura .................... 341/143 |
| 5,760,726 A | 6/1998 | Koifman et al. ............. 341/67 |
| 6,215,423 B1 | 4/2001 | May et al. .................... 341/61 |
| 6,340,940 B1 | 1/2002 | Melanson ................... 341/143 |
| 6,348,884 B1 | 2/2002 | Steensgaard-Madsen .... 341/118 |
| 6,385,588 B2 | 5/2002 | Van Der Vleuten ........ 704/504 |
| 6,426,714 B1 | 7/2002 | Ruha et al. ................. 341/118 |
| 6,531,973 B2 | 3/2003 | Brooks et al. ............. 341/143 |
| 6,577,261 B2 * | 6/2003 | Brooks et al. ............. 341/144 |

FOREIGN PATENT DOCUMENTS

| EP | 0 899 884 | 3/1999 |
| EP | 1 162 749 | 12/2001 |

OTHER PUBLICATIONS

Adams, R. et al., "A 113dB Oversampling DAC with Segmented Noise–Shaped Scrambling," *IEEE International Solid–State Circuits Conference Digest of Technical Papers*, IEEE, vol. 41, Feb. 1998, pp. 62–63.

(List continued on next page.)

*Primary Examiner*—Peguy JeanPierre
(74) *Attorney, Agent, or Firm*—Sterne, Kessler, Goldstein & Fox P.L.L.C.

(57) ABSTRACT

Methods and apparatuses for spectrally shaping mismatch errors in a multi-bit digital to analog converter (DAC). In an embodiment, the multi-bit DAC is constructed from K separate multi-element sub-DACs, where K and the number of elements in each sub-DAC are each preferably greater than two. A received digital input code is split into a set of K sub-codes corresponding to the digital input code. The set of K sub-codes can have one of at least N different sub-code orders that specify an order of each of the K sub-codes with respect to one another, where N>2. A sum of the K sub-codes equals the digital input code. One of the at least N different sub-code orders is selected using a shuffling algorithm. Then, each sub-code in the set of K sub-codes is output in accordance with the selected sub-code order.

19 Claims, 18 Drawing Sheets

OTHER PUBLICATIONS

Baird, R. and Fiez, T., "Linearity Enhancement of Multibit ΔΣ A/D and D/A Converters Using Data Weighted Averaging," *IEEE Transactions on Circuits and Systems II: Analog and Digital Signal Processing*, IEEE, vol. 42, No. 12, Dec. 1995, pp. 753–762.

Carley, L.R., "A Noise–Shaping Coder Topology for 15+ Bit Converters," IEEE Journal of Solid–State Circuits, IEEE, vol. 24, No. 2, Apr. 1989, pp. 267–273.

Chen, F. and Leung, B., "A High Resolution Multibit Sigma–Delta Modulator with Individual Level Averaging," *IEEE Journal of Solid–State Circuits*, IEEE, vol. 30, No. 4, pp. 453–460.

Fogleman, E. et al., "An Area–Efficient Differential Input ADC with Digital Common Mode Rejection," *Proceedings of the IEEE International Symposium on Circuits and Systems*, IEEE, Jun. 1999, 4 pages.

Fogleman, E. et al., "A Dynamic Element Matching Technique for Reduced–Distortion Multibit Quantization in Delta–Sigma ADCS," *Proceedings of the International Symposium on Circuits and Systems*, IEEE, Jun. 1999, 4 pages.

Fogleman, E. et al., "A 3.3V Single–Poly CMOS Audio ADC Delta–Sigma Modulator with 98dB Peak SINAD," *Proceedings of the IEEE 1999 Custom Integrated Circuits Conference*, IEEE, May 1999, pp. 121–124.

Galton, I., "Spectral Shaping of Circuit Errors in Digital-to-Analog Converters," *IEEE Transactions on Circuits and Systems II: Analog and Digital Signal Processing*, IEEE, vol. 44, No. 10, Oct. 1997, pp. 808–817.

Galton, I., "Noise–Shaping D/A Converters for ΔΣ Modulation," Proceedings of the 1996 IEEE International Symposium on Circuits and Systems, IEEE, 1996, pp. 441–444.

Galton, I., "A Rigorous Error Analysis of D/A Conversion with Dynamic Element Matching," *IEEE Transactions on Circuits and Systems II: Analog and Digital Signal Processing*, IEEE, vol. 42, No. 12, Dec. 1995, pp. 763–772.

Henderson, R.K. and Nys, O.J.A.P., "Dynamic Element Matching Techniques with Arbitrary Noise Shaping Function," *Proceedings of the 1996 IEEE International Symposium on Circuits and Systems*, IEEE, vol. 1, May 1996, pp. 293–296.

Jensen, H. and Galton, I., "A Hardware–Efficient DAC for Direct Digital Synthesis," *Proceedings of the IEEE International Symposium on Circuits and Systems*, IEEE, Jun. 1996, pp. 97–100.

Jensen, H. and Galton, I., A Reduced–Complexity Mismatch–Shaping DAC for Delta–Sigma Data Converters, *Proceedings of the IEEE International Symposium on Circuits and Systems*, IEEE, Jun. 1998, pp. I504–I507.

Jensen, H. and Galton, I., "Yield Estimation of a First–Order Noise–Shaping D/A Converter," *Proceedings of the IEEE International Symposium on Circuits and Systems*, IEEE, Jun. 1997, pp. 441–444.

Jensen, H. and Galton, I., "A Low–Complexity Dynamic Element Matching DAC for Direct Digital Synthesis," *IEEE Transactions on Circuits and Systems II: Analog and Digital Signal Processing*, vol. 45, No. 1, Jan. 1998, pp. 13–27.

Ju, P. et al., A 22–kHz Multibit Switched–Capacitor Sigma–Delta D/A Converter with 92 dB Dynamic Range, *IEEE Journal of Solid–State Circuits*, vol. 30, No. 12, Dec. 1995, pp. 1316–1325.

Keady, A. and Lyden, C., "Tree structure for mismatch noise–shaping multibit DAC," *Electronic Letters*, IEEE, vol. 33, No. 17, Aug. 14, 1997, pp. 1431–1432.

Kwan, T. et al., "A Stereo Multibit ΣΔ DAC with Asynchronous Master–Clock Interface," *IEEE Journal of Solid–State Circuits*, IEEE, vol. 31, No. 12, Dec. 1996, pp. 1881–1887.

Leung, B. and Sutarja, S., "Multibit Σ–Δ A/D Converter Incorporating a Novel Class of Dynamic Element Matching Techniques," *IEEE Transactions on Circuits and Systems II: Analog and Digital Signal Processing*, vol. 39, No. 1, Jan. 1992, pp. 35–51.

Schreier, R. and Zhang, B., "Noise–shaped multibit D/A converter employing unit elements," *Electronic Letters*, IEEE, vol. 31, No. 20, Sep. 28, 1995, pp. 1712–1713.

Yasuda, A. et al., "A 100kHz 9.6mW Multi–bit ΔΣ DAC and ADC using Noise Shaping Dynamic Elements Matching with Tree Structure," *Proceedings of the 1998 IEEE International Solid–State Circuits Conference Digest of Technical Papers*, Feb. 1998, pp. 64–65.

Baird, R. et al., "Improved ΣΔ DAC linearity using data weighted averaging," Proceedings of the 1995 IEEE International Symposium on Circuits and Systems, IEEE, Apr. 30–May 1995, pp. 13–16.

Carley, L.et al., A 16 bit 4'th Order Noise–Shaping D/A Converter, *IEEE Proceedings of the CICC*, IEEE, 1988, pp. 482–485.

Schreier, R., "Am empirical study of high–order, single–bit delta sigma modulators," *IEEE Transactions on Circuits and Systems II: Analog and Digital Signal Processing*, IEEE, vol. 40, No. 8, Aug. 1993, pp. 461–466.

Jensen, H. and Galton, I., "A Performance Analysis of the Partial Randomization Dynamic Element Matching DAC Architecture," *Proceedings of the IEEE International Symposium on Circuits and Systems*, IEEE, Jun. 1997, pp. 9–12.

Lin, H. et al., "Multi–Bit DAC with Noise–Shaped Element Mismatch," *Proceedings of the IEEE International Symposium on Circuits and Systems*, IEEE, 1996, pp. 235–238.

Nys. O.J.A.P. and Henderson, R.K., "An Analysis of Dynamic Element Matching Techniques in Sigma–Delta Modulation," *Proceedings of the IEEE International Symposium on Circuits and Systems*, IEEE, 1996, pp. 231–234.

* cited by examiner

METHOD AND APPARATUS FOR MISMATCHED SHAPING OF AN OVERSAMPLED CONVERTER

CROSS-REFERENCE TO RELATED APPLICATIONS

The application is a continuation of U.S. application Ser. No. 09/949,807, filed Sep. 12, 2001, now U.S. Pat. No. 6,628,218, which claims priority to U.S. Provisional Patent Application No. 60/231,991, entitled "A Mismatch Shaping Method for Oversampled Data Converters," filed Sep. 11, 2000, and U.S. Provisional Patent Application No. 60/232,155, entitled "A Mismatched Shaping Method for Oversampled Data Converters for Use in an Analog Front End in a DOCSIS Compatible Cable Modem," filed Sep. 11, 2000, and is a continuation of U.S. application Ser. No. 09/949,815, now U.S. Pat. No. 6,577,261, filed Sep. 12, 2001, which claims priority to U.S. Provisional Patent Application No. 60/231,991, entitled "A Mismatch Shaping Method for Oversampled Data Converters," filed Sep. 11, 2000, and U.S. Provisional Patent Application No. 60/232,155, entitled "A Mismatched Shaping Method for Oversampled Data Converters for Use in an Analog Front End in a DOCSIS Compatible Cable Modem," filed Sep. 11, 2000, all of which are assigned to the assignee of the present invention, and all of which are incorporated herein by reference in their entirety.

BACKGROUND OF THE INVENTION

1. Field of the Invention

The present invention relates to sigma-delta digital to analog converters (DACs), and more particularly to methods and apparatuses for mismatch shaping of an oversampled converter. Even more specifically, the present invention relates to mismatch shaping networks for use in multi-bit DACs.

2. Background Art

It is known to process analog signals using digital circuitry. Typically, such circuitry converts analog signal to binary values, arithmetically manipulates the binary values with binary circuitry to perform filtering and digital signal processing, and then converts the processed binary values back into analog signals (e.g., for sound reproduction). To minimize the circuitry required to convert the analog signals to binary values, sigma-delta modulators are often utilized.

Sigma-delta modulators sample the analog signal at a rate that is orders of magnitude greater than the highest frequency present. Sigma-delta modulators use the technique of oversampling and noise shaping to move most of the quantization noise outside the band of the signal. The out of band noise may then be filtered out such that the signal to noise ratio (SNR) within the signal band is significantly increased.

The use of a multi-bit sigma-delta DAC lowers the in-band and out of band quantization noise as compared to single bit modulators with single bit DACs. However, multi-bit modulators typically require multi-bit DACs with highly linear performance. The linearity of a multi-bit DAC is typically limited by how precise analog elements, such as capacitors, resistors or current sources, can be matched. The linearity performance of analog components fabricated with standard CMOS techniques is less than 13 bits. Therefore, mismatch shaping circuitry is often utilized to improve the linearity performance of the analog components. Mismatch shaping circuitry shapes the mismatches in the analog unit elements to substantially reduce errors in the signal band of an oversampling converter.

A method and apparatus for performing dynamic element matching is disclosed in Leung, U.S. Pat. No. 5,406,283, entitled "Multi-bit oversampled DAC with dynamic element matching." The Leung patent discloses a technique for cyclically selecting successive different permutations of the unit elements for converting each value of the output digital signal thereby canceling the mismatching between unit elements. However, the digital complexity of such a method increases tremendously with the number of bits in the digital output. For example, a typical implementation of such a system requires an encoder for each value of output digital signal, a memory element or pointer for each digital value and a M×M cross-point switch, where M is the number of unit elements. Therefore, as the number of unit elements doubles the encoder and memory elements required increases by a factor of two but the cross-point switch complexity and hardware increases by a factor of four, or more generally as a square term.

In addition, there is a possibility for pattern noise to occur since the unit elements are cyclically selected. For example, if the same code is output each time and if there are mismatches on the unit elements, a spur may occur at a frequency given by the inverse of the cyclical selection period.

Therefore, it would be advantageous to provide a method and apparatus for mismatch shaping of oversampled data converters that does not suffer from the above described design complexity and pattern noise errors.

BRIEF SUMMARY OF THE INVENTION

An embodiment of the present invention is directed to a method and apparatus for spectrally shaping mismatch errors in a multi-bit digital to analog converter (DAC) constructed from K separate multi-element sub-DACs, where K and the number of elements in each sub-DAC are each preferably greater than two. A received digital input code is split into a set of K sub-codes corresponding to the digital input code. The set of K sub-codes can have one of at least N different sub-code orders that specify an order of each of the K sub-codes with respect to one another, where N>2. A sum of the K sub-codes equals the digital input code. One of the at least N different sub-code orders is selected using a shuffling algorithm. Then, each sub-code in the set of K sub-codes is output in accordance with the selected sub-code order.

In an embodiment of the present invention, each of the K sub-codes is not different than any of the other K−1 sub-codes within the set of K sub-codes by more than one level.

According to an embodiment of the present invention, the shuffling algorithm is a dynamic element mismatch shaping algorithm. In this embodiment, the selecting the one of the at least N different sub-code orders is performed using the dynamic element mismatch shaping algorithm.

In an embodiment of the present invention, the selecting of the one of the at least N different sub-code orders based on (1) one or more sub-code orders that were previously selected, and/or (2) a pseudo random code.

In an embodiment, each sub-code in the set of K sub-codes is provided to a respective one of K shufflers in accordance with the selected sub-code order. Each of the K sub-codes is then separately shuffled using the respective shuffler to thereby produce K separate multi-bit shuffled density codes. In an embodiment, each of the K shuffled density codes is then provided to a respective one of K multi-element sub-digital-to-analog converters (sub-DACs), in accordance with the selected sub-code order. Each of the K multi-element sub-DACs is driven using the respective one of the K shuffled density codes. A plurality of analog signals are thereby produced and combined to produce a combined analog signal representative of the received digital input signal.

According to an embodiment of the present invention, a range signal is produced based on a received digital input code. The range signal specifies which one of a plurality of ranges the digital input code is within. A density code is then produced. The density code specifies a level within the range expressed by the range signal. The producing of the density code may include selecting one of a plurality of orders for the density code using a shuffling algorithm, wherein each of the orders specify an order of bits in the density code. Preferably, as these steps are repeated, each one of the different orders, on average, is selected substantially the same number of times.

The range signal and the density code are then combined to thereby produce a plurality of sub-codes. A sum of the plurality of sub-codes equals the digital input code. Each of the plurality of sub-codes are preferably shuffled to produce a plurality of shuffled density codes. Each of the plurality of shuffled density codes is then provided to a respective multi-element sub-digital-to-analog converter (sub-DAC). The sub-DACs convert the shuffled density codes to analog signals, the sum of which equal the received digital input code from which the range and density signal were produced.

In an embodiment of the present invention, a digital input code having a first value V1 is received. A second digital value V2 is then produced, Wherein V2 equals a greatest integer less than V1÷K, where K>2. Additionally, a third digital value V3 is produced, where V3 equals V1 modulo K. Next, a shuffled density code is produced based on the third digital value V3. The shuffled density code includes K bits each of which has a value of 0 or 1. An order of the K bits with respect to one another is based on a shuffling algorithm. Then, V2 is separately added to each of the K bits to produce K separate further digital outputs $V4_1 \ldots V4_K$. A sum of the K separate further digital outputs equals the first $$\text{value } V1 \left[ i.e., \sum_{i=1}^{k} V4_i = V1 \right].$$

Each of the K separate further digital outputs $V4_1 \ldots V4_K$ can then be provided to one of K separate shufflers. Each of the digital outputs $V4_1 \ldots V4_K$ is then shuffled using one of the K shufflers to produce a respective shuffled density code, thereby producing K shuffled density codes for each digital input code.

Each of the K shuffled sub-codes is then provided to a separate one of K multi-bit sub-digital-to-analog converters (sub-DACs). The sub-DACs are used to convert each of the K shuffled density codes to analog signals, thereby producing a plurality of analog signals. The plurality of analog signals are then combined to produce a combined analog signal that is representative of the first value V1.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

Table of Contents

I. Exemplary Environments
II. High Level Overview of Present Invention
II. High Level Overview of Code Splitter and Code Shuffler
   A. Range Selector
   B. Density Generator
   C. Combiner
IV. First Detailed Embodiment of Mismatch Shaping Network
   A. Code Splitter and Code Shuffler
      1. Binary-to-One Encoder
      2. Shufflers of the Code Splitter and Code Shuffler
      3. Four-State State Machines
      4. Adder Block 5. MUX
B. Shufflers of Mismatch Shaping Network
C. Summary of First Embodiment
V. Second Embodiment of Mismatch Shaping Network
A. High Level Overview of Second Embodiment
B. First Implementation
C. Second Implementation
D. Variations on Second Embodiment
VI. Flow Diagrams
VII. Conclusion The following description is of the best modes presently contemplated for practicing the invention. This description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout.

I. Exemplary Environments

Figure 1:
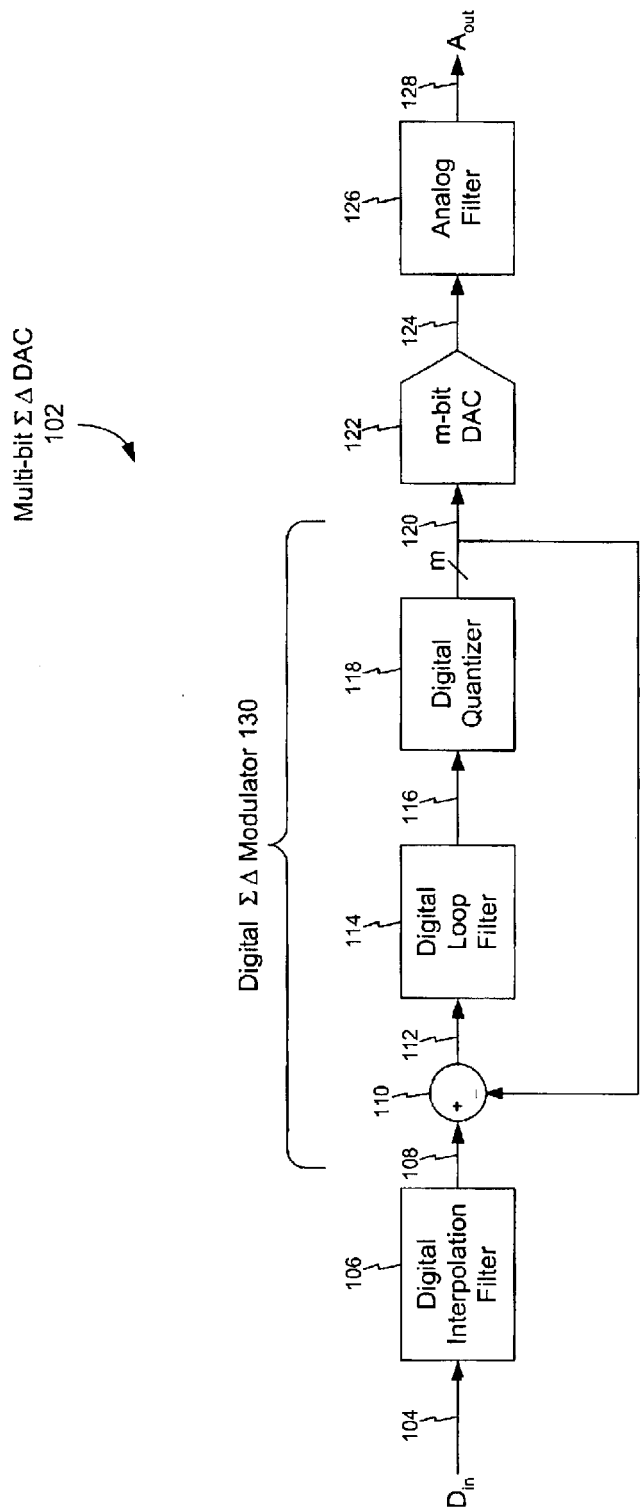
FIG. 1 illustrates an exemplary environment including a digital sigma delta modulator, in which the present invention can be useful.

FIG. 1 shows an exemplary environment in which the present invention is useful. More specifically, FIG. 1 shows an exemplary multi-bit sigma-delta ($\Sigma\Delta$) digital to analog converter (DAC) 102. Multi-bit $\tau\Delta$ DAC 102 includes a digital interpolation filter 106, a differencer 110, a digital loop filter 114, a digital qualitizer 1118, a multi-bit DAC 122 and an analog filter 126. Differencer 110, digital loop filter 114 and digital quantizer 118, arranged with a feedback loop as shown in FIG. 1, is often referred to as a digital $\Sigma\Delta$ modulator 130.

Digital interpolation filter 106 receives a digital input signal 104, which is for example a 32 bit digital signal containing audio information. Filter 106 outputs an interpolated digital signal 108. Differencer 110 subtracts a feedback signal 120 from interpolated digital signal 108 to produce an error signal 112. Digital loop filter 114 filters error signal 112 to produce a filtered error signal 116. Digital quantizer 118 quantizes signal 116 into a predetermined number of levels and outputs multi-bit signal 120 (e.g., a 5 bit signal having 17 levels, binary 00000 through binary 10000). As mentioned above, multi-bit signal 120 is used in a feedback loop (and thus, is also referred to as feedback signal 120) to produce error signal 112. Multi-bit signal 120 is also provided to multi-bit DAC 122, which performs mismatch shaping, for example, in accordance with an embodiment of the present invention. Multi-bit DAC 122 outputs an analog signal 124 that is preferably filtered by analog filter 126 (e.g., a low pass or band pass filter) to produce a filtered analog signal 128. Filtered analog signal 128 can be used, for example, to drive a speaker to produce an audio output.

Figure 2:
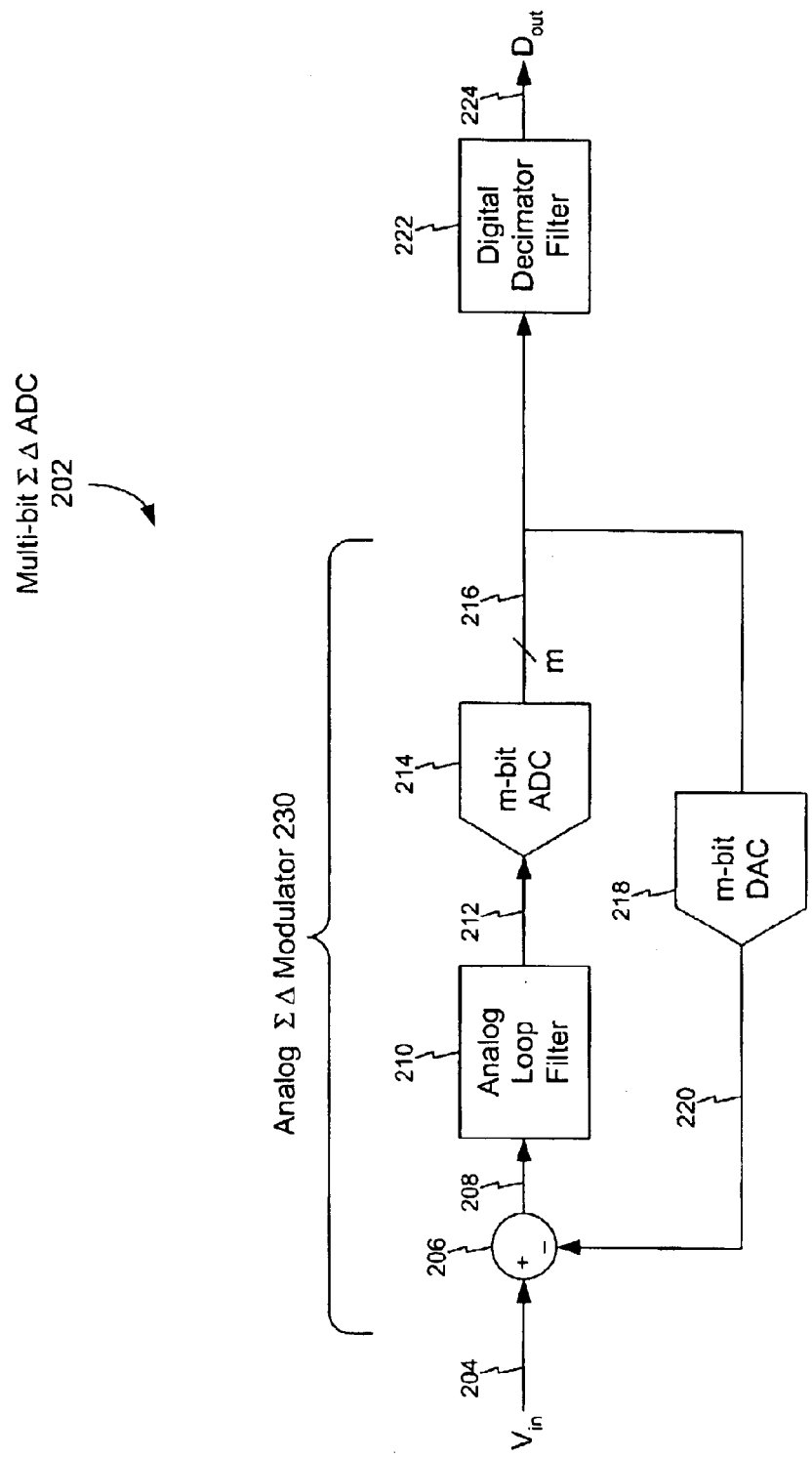
FIG. 2 illustrates an exemplary environment including an analog sigma delta modulator, in which the present invention can be useful.

FIG. 2 shows another exemplary environment in which the present invention is useful. More specifically, FIG. 2 shows a multi-bit sigma-delta ($\Sigma\Delta$) analog to digital converter (ADC) 202. Multi-bit $\Sigma\Delta$ ADC includes a differencer 206, an analog loop filter 210, a multi-bit ADC 214 a multi-bit DAC 218 (arranged in a feed back loop), and a digital decimator filter 222. Differencer 206, analog loop filter 210, multi-bit ADC 214 and multi-bit DAC 218 arranged in the feed back loop as shown in FIG. 2, is often referred to as an analog $\Sigma\Delta$ modulator 230.

Differencer 206 receives an analog input signal 204, and subtracts an analog feedback signal 220 from input signal 204 to produce an error signal 208. Analog loop filter 210 filters error signal 208 to produce a filtered error signal 212. Multi-bit ADC 214 converts the analog signal 212 to a multi-bit digital signal 216 (e.g., a 5 bit signal having 17 levels, binary 00000 through binary 10000). Multi-bit digital signal 216 is provided to digital decimator filter 222, which produces a decimated digital output signal 224. Multi-bit digital signal 216 is also provided to multi-bit DAC 218, which performs mismatch shaping, for example, in accordance with an embodiment of the present invention. The analog signal 220 produced by multi-bit DAC 218 is used as a feedback signal (and thus, is also referred to as feedback signal 220).

Referring back to FIG. 1, the present invention provides a mismatch shaping network for multi-bit DAC 122, which receives a multi-bit digital signal 120 from digital $\Sigma\Delta$ modulator 130. Referring to FIG. 2, the present invention can also provide a mismatch shaping network for multi-bit DAC 218 (used in the feedback loop), which receives a multi-bit digital signal 216 from multi-bit ADC 214 of analog $\Sigma\Delta$ modulator 230. Stated another way, the present invention is used to spectrally shape mismatch errors associated with multi-bit DACs 122 and 218.

The above described exemplary environments are useful for showing how the present invention can be used. However, these exemplary environments are not meant to be limiting. One of ordinary skill in the art will appreciate from the following description that the present invention can be used in many other environments.

II. High Level Overview of Present Invention

Figure 3:
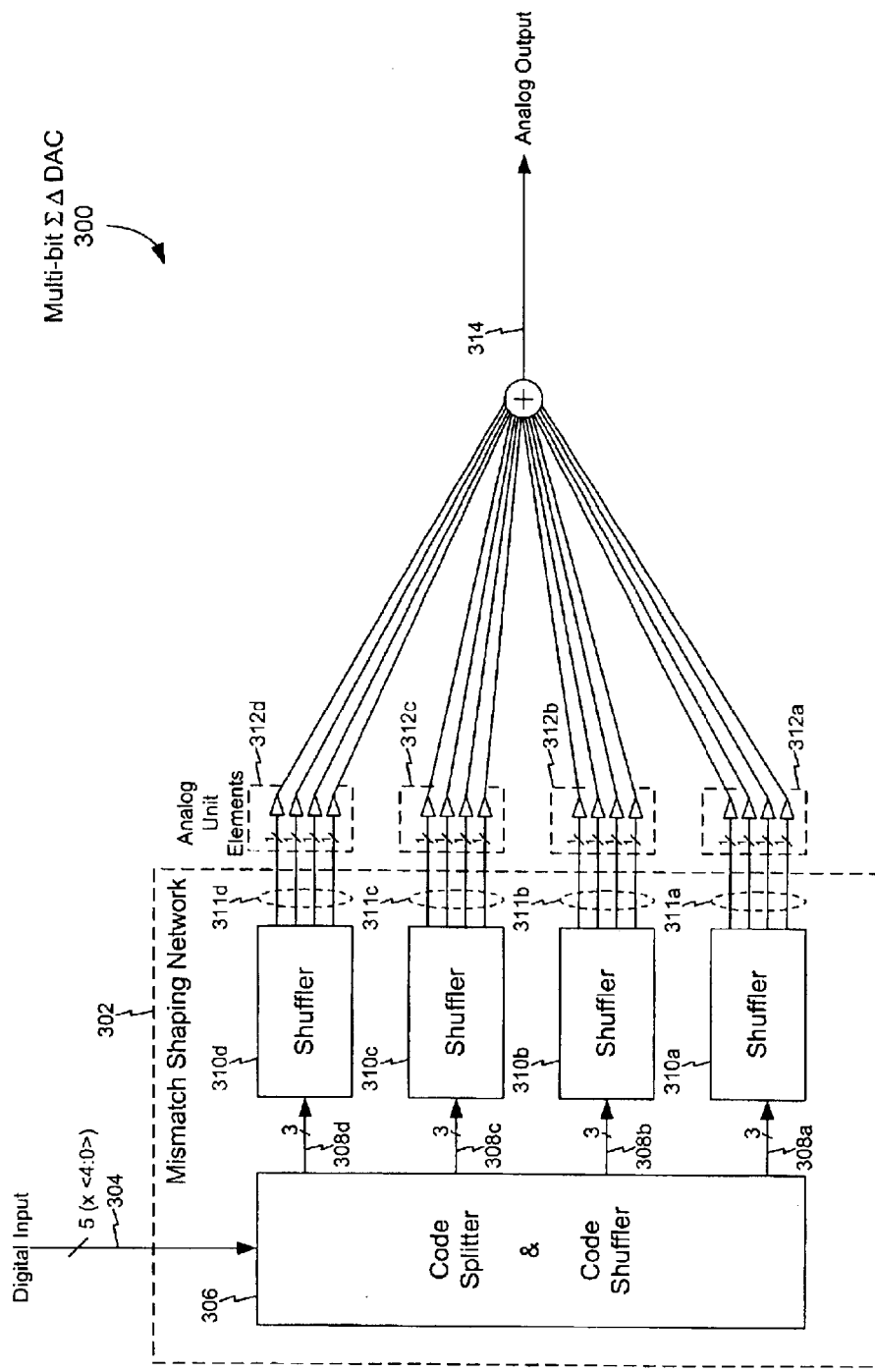
FIG. 3 is a high level block diagram that includes a mismatch shaping network, according to an embodiment of the present invention.

FIG. 3 shows a block diagram of a multi-bit DAC 300 (e.g., multi-bit DAC 122 or 218) that includes a mismatch shaping network 302 (also known as a dynamic element matching encoder). According to an embodiment of the present invention, mismatch shaping network 302 includes a code splitter & and code shuffler (CSCS) 306; and four separate shufflers 310a, 310b, 310c and 310d. Multi-bit DAC 300 receives a digital input signal 304 (e.g., multi-bit digital signal 120 or 216) and converts it to an analog output signal 314 representative of the digital input signal 304. As will be appreciated from the following description, the term "mismatch shaping" hereafter also refers to the shaping of mismatches in analog circuitry between sub-DACs (e.g., 312a, 312b, 312c and 312d) as well as the shaping of mismatches in analog unit elements within each sub-DAC.

A shuffler is hereafter defined as a block which receives a digital input signal and produces an output digital density signal in which the order of the ones and zeros in the output digital density signal is not correlated to the digital input signal (and thus, the outputs of shufflers are also referred to as shuffled density codes). A shuffling algorithm is the algorithm used by a shuffler to produce such an uncorrelated output based on an input signal. For example, one common implementation of a shuffler is a dynamic element mismatch circuit that implements a dynamic element mismatch shaping algorithm. This type of shuffler implementation typically includes one or more memory elements to track the order of the ones and zeros produced previously in the output digital density signal. Another shuffler implementation either includes a pseudo-random sequence generator to generate a pseudo-random sequence or it receives a pseudo-random sequence. In this second shuffler implementation the pseudo-random sequence is used to randomize the location of the ones and zeros in the output digital density sequence. A shuffler may also use a combination of dynamic element mismatch circuitry and a pseudo random sequence to ensure that the order of the ones and zeros in the output digital density signal is not correlated to the digital input signal.

The density of a digital signal (and more specifically the density of digital words of the digital signal) specifies how many of the bits in a word are a specific bit or logic value (i.e., logic one). Four bit words will be used to explain this concept. A four bit word can have a density of zero, ¼th, ½, ¾th or one. More specifically, the four bit word "0000" has a density of 0/4th (i.e., zero). The four bit words "0001", "0010", "0100" and "1000", each have a density of ¼th. The four bit words "0011", "0110", "1100", "1001", "1010" and "0101", each have a density of 2/4th (i.e., ½). The four bit words "1110", "1101", "1011" and "0111", each have a density of ¾th. The four bit word "1111" has a density of 4/4th (i.e., one).

Referring back to FIGS. 1 and 2, CSCS 306 can for example receive digital input signal 304 from a digital ΣΔ modulator (e.g., digital ΣΔ modulator 130) or from a multi-bit ADC (e.g., multi-bit ADC 214) of an analog ΣΔ EA modulator (e.g., analog ΣΔ modulator 230). Alternatively, the present invention can be used in an environment that does not include a ΣΔ modulator. For example, referring to FIG. 1, if digital ΣΔ modulator 130 were replaced with a simple quantizer, CSCS 306 would receive digital input signal 304 directly from the quantizer. These are just a few example environments in which the present invention can be used.

Each digital word of digital signal 304 shall often be referred to herein as a digital input code, or simply as an input code. Referring again to FIG. 3, in this exemplary embodiment CSCS 306 splits each digital input code into four sub-codes 308a, 308b, 308c and 308d (also referred to collectively as a "set of sub-codes"), and provides each of the four sub-codes 308a, 308b, 308c and 308d to one of the four separate shufflers 310a, 310b, 310c and 310d.

CSCS 306 splits input code 304 into the four sub-codes 308a, 308b, 308c and 308d as equitably as possible (i.e., so each of the four sub-codes is not different than any of the other three sub-codes by more than one level, as will be clear from example shown below). The sum of the four sub-codes 308a, 308b, 308c and 308d (i.e., the sum of the set of sub-codes) is equal to digital input code 304. According to an embodiment of the present invention, the way codes are split (i.e., the order of the sub-codes with respect to one another) is dependent on the incoming digital input code 304 as well as one or more memory elements that track how that particular code was previously split. A particular sub-code is preferably cycled to each of the multiple shufflers 310a, 310b, 310c and 310d to implement mismatch shaping at the sub-code level. Specific implementations of CSCS 306 are described in detail below. Provided first is a more detailed overview of CSCS 306 (also referred to simply as "splitter 306").

As mentioned above, each input code 304 is as equitably split as possible into four sub-codes 308a, 308b, 308c and 308d. For example, an incoming code of seven may initially be split into four sub-codes 2, 2, 2, 1, where 2+2+2+1=7 (notice that each of the four sub-codes is not different than any of the other three sub-codes by more than one level). In addition, the first sub-code of 2 may initially be assigned to first shuffler 310a. Similarly, the second sub-code of 2 may initially be assigned to second shuffler 310b, the third sub-code of 2 may initially be assigned to third shuffler 310c, and the last sub-code of 1 may be initially assigned to fourth shuffler 310d. The next time a code of seven is input into CSCS 306 it may be split into 2+2+1+2, the next time 2+1+2+2, and the next time 1+2+2+2. CSCS 306 may then cycle back the next time a code of seven appears as the input, depending on the specific implementation. No memory elements are needed for an input code of eight, since each of the four shufflers will always be assigned a value of two.

Table 1 is a splitter sub-code table illustrating the way splitter 306 may split digital input code 304 into four separate sub-codes. The first column of Table 1 identifies the possible values of digital input code 304. As can be seen from the table, digital input code 304 in this example is a seventeen level code. The next four columns of Table 1 specify the members (i.e., values) of the sub-code sets that correspond to the input codes in the first Column. For example, the sub-code set corresponding to an input code of seven includes values 2, 2, 2 and 1, as mentioned above. The last column of Table 1 lists the total number of different sub-code combinations that can be produced when an input code is split. For example, as mentioned above an incoming code of seven can be split into four sub-code combinations, 2+2+2+1, 2+2+1+2, 2+1+2+2 and 1+2+2+2. Notice that for each input code, the members of the corresponding sub-code set remain the same. Only the sub-code order associated with the set changes (i.e., the order of the sub-codes in the set with respect to one another). Accordingly, a sub-code "combination" can be thought of as a sub-code set associated with a sub-code order. Thus, the last column of Table 1 can be thought of as specifying the number of different sub-code orders that can be associated with a sub-code set.

In another example, an incoming code of six can be split into four sub-codes with six different combinations, namely, 2+2+1+1, 2+1+1+2, 1+1+2+2, 2+1+2+1, 1+2+1+2 and 1+2+2+1. Therefore, if an input code of six appears six times in a row, the splitter may cycle through all the available combinations. However, use of all six combinations may not be necessary because the inventors have determined that for each digital input code 304 having six available combinations (i.e., inputs codes 2, 6, 10 and 14, as shown in Table 1), sufficient mismatch shaping performance is achieved using just two or four of the six possible combinations. This can simplify the implementation of splitter 306.

TABLE 1

| | Splitter Sub-code Table | | | | |
|---|---|---|---|---|---|
| Input Code (binary) | Sub-code 1 | Sub-code 2 | Sub-code 3 | Sub-code 4 | # of Combinations |
| 16(10000) | 4 | 4 | 4 | 4 | 1 |
| 15(01111) | 4 | 4 | 4 | 3 | 4 |
| 14(01110) | 4 | 4 | 3 | 3 | 6 |
| 13(01101) | 4 | 3 | 3 | 3 | 4 |
| 12(01100) | 3 | 3 | 3 | 3 | 1 |
| 11(01011) | 3 | 3 | 3 | 2 | 4 |
| 10(01010) | 3 | 3 | 2 | 2 | 6 |
| 9(01001) | 3 | 2 | 2 | 2 | 4 |
| 8(01000) | 2 | 2 | 2 | 2 | 1 |
| 7(00111) | 1 | 2 | 2 | 2 | 4 |
| 6(00110) | 1 | 1 | 2 | 2 | 6 |
| 5(00101) | 1 | 1 | 1 | 2 | 4 |
| 4(00100) | 1 | 1 | 1 | 1 | 1 |
| 3(00011) | 0 | 1 | 1 | 1 | 4 |
| 2(00010) | 0 | 0 | 1 | 1 | 6 |
| 1(00001) | 0 | 0 | 0 | 1 | 4 |
| 0(00000) | 0 | 0 | 0 | 0 | 1 |

In the described exemplary embodiment, sub-codes 308a, 308b, 308c and 308d are converted to shuffled density codes by shufflers 310a, 310b, 310c and 310d. At each shuffler 310a, 310b, 310c and 310d, the individual sub-code is preferably shuffled using dynamic element mismatch techniques combined with a pseudo random sequence. This combination can be used to provide minimal correlation between sub-codes and the order of the ones and zeros in the output digital density signal produce by each shuffler 310. An exemplary implementation of shufflers 30, according to an embodiment of the present invention, is explained below with reference to FIG. 10.

In the described exemplary embodiment, the four shufflers 310a, 310b, 310c and 310d process each of the sub-codes 308a, 308b, 308c and 308d. More specifically, each of the shufflers (e.g., 310a) shuffles one of the four sub-codes (e.g., 308a) to produce a four-bit shuffled density code (e.g., 311a) made up of four separate 1-bit outputs. Each of the four separate 1-bit outputs, which is either HIGH or LOW, is provided to an analog unit element. Each analog unit element is shown as a triangle in FIG. 3. Each group of four analog unit elements can be thought of as a four element sub-DAC 312, which is also referred to as a multi-bit sub-DAC. Sub-DACs 312a, 312b, 312c and 312d are nominally identical multi-level sub-DACs that have non-ideal gain and offset. The outputs (311a, 311b, 311c and 311d) of each shuffler 310a, 310b, 310c and 310d drives one of the four separate four element sub-DACs 312a, 312b, 312c and 312d.

The various sub-code combinations produced by CSCS 306 has the effect of moving the in-band component of error energy due to the effect of gain mismatch errors in sub-DACs 312a, 312b, 312c, and 312d to out-of-band frequencies. CSCS 306 provides mismatch shaping of mismatch errors between sub-DACs and/or it whitens the error energy resulting from mismatch errors between sub-DACs and spreads the error energy throughout the frequency band from DC to fs/2 (where fs represents the sample rate of the sub-DACs). This substantially reduces the component of in-band error energy due to mismatch between the sub-DACs. The shufflers 310a, 310b, 310c, and 310d provide mismatch shaping of element mismatch errors within each sub-DAC and/or whiten the error energy resulting from mismatch errors between elements in each sub-DAC and spread the error energy throughout the frequency band from DC to fs/2. This substantially reduces the component of in-band error energy due to mismatch errors between elements in each sub-DAC. The combination of CSCS 306 and shufflers 310a, 310b, 310c, and 310d is to reduce the in-band component of all the error energy associated with mismatch errors in sub-DACs 312a, 312b, 312c, and 312d.

In the example embodiment shown in FIG. 3, there are sixteen (16) analog unit elements (shown as triangles) being driven (i.e., flipped or switched). When the input to an analog unit element is HIGH, the analog unit element will output a first analog value (e.g., 100 $\mu$A), and the element is considered ON (i.e., flipped or switched on). When the input to an analog unit element is LOW, the analog unit element will output a second analog value (e.g., 0 $\mu$A), and the element is considered OFF (i.e., flipped or switched off). The plurality of elements are said to be "mismatched" if each of the plurality of unit elements does not output the exact same first and second analog values as the other unit elements. For example, when a first element is ON it may output 104 $\mu$A, where a second element may output 98 $\mu$A when ON, and a third element may output 111 $\mu$A when ON. The present invention performs mismatch shaping to overcome or compensate for such mismatch.

As shown in FIG. 3, the outputs of the sixteen (16) analog unit elements are added together, for example, on a wire, to produce an analog output 314 that is representative of the digital input 304. In this example, each of the unit elements (shown as triangles) are evenly weighted such that if the elements were perfectly matched, then the first analog value associated with each of the elements would be equal, and the second analog value associated with each of the elements would be equal. Accordingly, in this exemplary embodiment, analog output 314 can have one of seventeen (17) different states (also referred to as levels or values). For example, the first level is when none of the sixteen elements are ON, the second level is when only one of the sixteen elements are ON, the third level is when two of the sixteen elements are ON, . . . and the seventeenth level is when all sixteen elements are ON. Five (5) binary bits are required to represent the seventeen different levels (even though five binary bits can represent up to thirty two levels). In the exemplary embodiment disclosed, digital input 304 is a seventeen level unsigned binary input. Accordingly, digital input 304 is shown as a five (5) bit binary word that can have a value between binary 00000 (decimal zero) and binary 10000 (decimal 16). If only sixteen (16) of the seventeen (17) possible states were utilized, then digital input 304 need only include four (4) binary bits that can have a value between binary 0000 (decimal zero) and binary 1111 (decimal 15). One of ordinary skill in the art should appreciate that digital input signal 304 can alternatively be a signed binary input or a thermometer-code input. One of ordinary skill in the art should also appreciate that digital input signal 304 need not be a binary signal.

The above described exemplary embodiment of the mismatch shaping network of the present invention is shown as splitting a digital input code into four sub-codes, which are each provided to one of four separate shufflers. However, one of ordinary skill in the art will appreciate from the following description that a digital input code can be split into a different number of sub-codes (i.e., other than four) while still being within the spirit and scope of the present invention. Preferably, the digital input code is split into more than two sub-codes. A shuffler may be provided for each sub-code. For example, if the digital input code is split into three sub-codes, then three shufflers may be used. One of ordinary skill in the art will also appreciate that shufflers other than 4-term shufflers can be used.

One of ordinary skill in the art will also appreciate that this invention may be useful without the benefit of shufflers at the output of CSCS 306 to shuffle each of the sub-codes. Depending upon the sub-DAC implementation, gain mismatch errors between sub-DACs may produce more in-band error energy than element mismatch errors within each sub-DAC. In this case it may be advantageous to reduce the overall complexity of the mismatch shaping circuitry by not including shufflers at the output of CSCS 306. One of ordinary skill in the art will also recognize that an obvious extension of this invention may be obtained by connecting the output of a code splitter and code shuffler, for example CSCS 306, to additional codes splitter and code shuffler blocks which further split each of the sub-codes into finer sub-codes.

III. High Level Overview of Code Splitter and Code Shuffler

Figure 4:
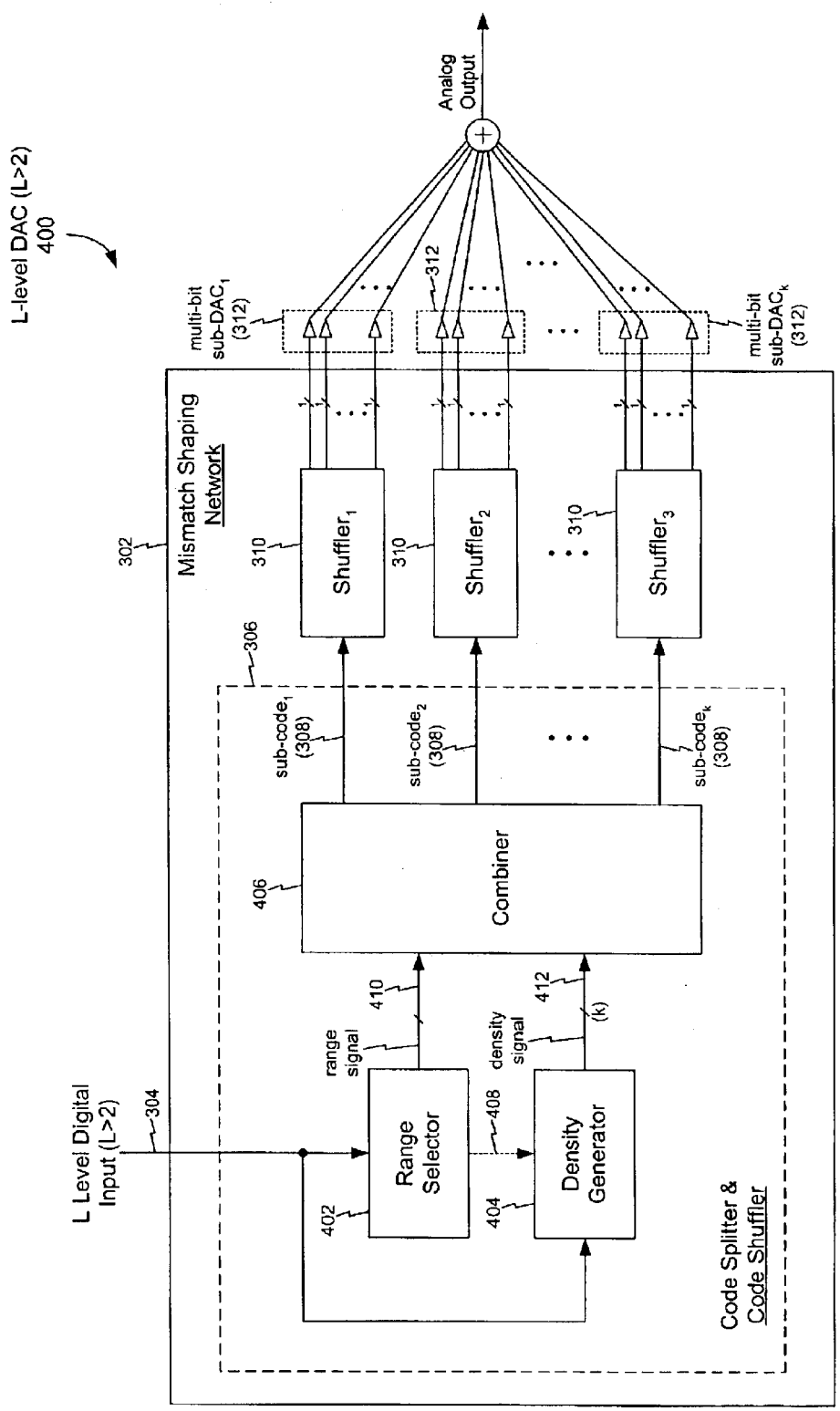
FIG. 4 is a block diagram that illustrates details of the code splitter and code shuffler of the mismatch shaping network of FIG. 3, according to an embodiment of the present invention.

FIG. 4 shows another block diagram of multi-bit DAC 300, also a referred to as an L-level DAC, where L is preferably greater than two (i.e., L>2). FIG. 4 is useful for explaining the operation of CSCS 306. As shown in FIG. 4. CSCS 306 includes a range selector 402, a density generator 404 and a combiner 406, each of which is discussed below.

A. Range Selector

Range selector 402 receives digital input signal 304 and determines which one of a plurality of predetermined ranges digital input signal 304 is within. Each digital word of digital input signal 304 represents one of L-levels (i.e., digital input signal 304 is an L-level signal), where L is preferably greater than two (i.e., L>2). Range selector 402 outputs a range signal 410 specifying the determined range of digital input signal 304. For example, assume digital input signal 304 is a 17 level signal (e.g., a binary word between 00000 and 10000, inclusive). Also assume that there are five (e.g., 0–4) predetermined ranges:

0) values between 0 and 3, inclusive;
1) values between 4 and 7, inclusive;
2) values between 8 and 11, inclusive;
3) values between 12 and 15, inclusive; and
4) value 16.

If, for example, range selector 304 receives a digital input signal 304 that equals binary 00101 (decimal 5), then range signal 310 will indicate that the digital input signal 304 is within the $1^{st}$ range. Notice that one of the ranges (i.e., the $4^{th}$ range) includes only one possible value.

If digital input signal 304 is a binary signal, then range selector 402 can make its level determination based on only the most significant bits (MSBs) of digital input signal 304. Continuing with the example where digital input signal 304 can be a binary word between 00000 and 10000, range selector 402 need only receive the three MSBs of digital input signal 304 to makes its level determination. For example: MSBs 000 represent the $0^{th}$ range; MSBs 001 represents the $1^{st}$ range; MSBs 010 represents the $2^{nd}$ range; MSBs 011 represents the $1^{st}$ range; and MSBs 100 represents the $4^{th}$ range. In such an embodiment, range selector 402 can be implemented as a binary to one-of encoder (also referred to as a one-of selector). If range selector 402 is implemented as a binary to one-of encoder, then range signal 410 can be a multi-bit signal, where only one of the multiple bits is HIGH at one time. For example, if there are five ranges, as in above example, then range signal can be a five bit (non-binary) signal, where: 00001 represents the $0^{th}$ range; 00010 represents the $1^{st}$ range; 00100 represents the $2^{nd}$ range; 01000 represents the $3^{rd}$ range; 10000 represents the $4^{th}$ range. This will be explained in more detail below.

B. Density Generator

Density generator 404 produces a K bit density signal 412 that indicates a level within the range expressed by range signal 410. Stated another way, density signal 412 indicates a difference between digital input signal 304 and the beginning value of a range. Density generator 404 produces density signal 412 based on digital input signal 304 and/or a modulo signal 408 produced by range selector 402. Continuing with the example where digital input signal 304 equals binary 00101 (decimal 5), which is within the $1^{st}$ range, density signal 412 will specify that digital input signal 304 is greater than the beginning of the $1^{st}$ range (i.e., 4) by a value of one (1). Thus, assuming for example that density signal 412 is a four bit density code, density signal 412 can be either 1000, 0100, 0010 or 0001 (each having a density of ¼th).

Assuming, for example, digital input signal 304 is greater than the beginning of the $1^{st}$ range by a value of two (i.e., if digital input signal 304 has a value of 6, then density signal 412 would have a density of ²⁄₄th (i.e., either 1100, 0011, 1010, 0101, 1001 or 0110). Similarly, if digital input signal 304 is greater than the beginning of the $1^{st}$ range by a value of three (i.e., if digital input signal 304 has a value of 7), then density signal 412 would have a density of ¾th (i.e., either 0111, 1011, 1101 or 1110). If the digital input signal 304 is equal to the beginning of the $1^{st}$ range (i.e., if digital input signal 304 has a value of 4), then density signal 412 would have a density of ⁰⁄₄th (i.e., 0000).

If digital input signal 304 is a binary signal, then density generator 404 can produce density signal 412 based on the least significant bits (LSBs) of digital input signal 304, Continuing with the example where digital input signal 304 can be a binary word between 00000 and 10000, then density generator 404 need only receive the two LSBs of digital input signal 304 to produce density signal 412. Again, assuming density signal 412 is a 4-bit density signal (e.g., K=4): if the two LSBs are 00, then density signal 412 equals 0000 to represent a density of zero (0); if the two LSBs are 01, then density signal 412 equals 0001, 0010, 0100 or 1000, to represent a density of ¼th; if the two LSBs are 10, then density signal 412 equals 0011, 1100, 1010, 0101, 0110, or 1001, to represent a density of ²⁄₄th; or if the two LSBs are 11, then density signal 412 equals 0111, 1011, 1101 or 1110, to represent a density of ¾th. Thus, if digital input signal 304 is the binary word 00101 (decimal 5) (and the two LSBs are 01), then density signal 412 equals 0001, 0010, 0100 or 1000, which represents a density of ¼th. This will be explained in more detail below.

For a given value of digital input code 304 (or for a given value of modulo signal 408), density generator 404 preferably produces a pattern of possible density codes such that, on average, each density code occurs approximately the same number of tires. For example, if digital input signal 304 has a value of five (e.g., binary 00101) four times in a row, then density generator 404 should produce a pattern of all variations 0001, 0010, 0100 and 1000, such that, on average, these four codes are produced approximately the same number of times.

C. Combiner

Combiner 406 produces K separate sub-codes based on both range signal 410 and density signal 412. K is preferably greater than two (i.e., K>2). The sum of the K sub-codes equals the digital input signal 304. Additionally, each of the K sub-codes are as equal to one another as possible, as explained above with reference to Table 1.

Assume that combiner 402 produces four separate sub-codes (i.e., K=4) based on range signal 410 and density signal 412, and that digital input signal 304 is a 17 level digital signal (i.e., L=17). Referring back to Table 1, discussed above: if digital input signal 304 is in the $0^{th}$ range (i.e., between decimal 0 and 3, inclusive), then the sub-codes are made up of zeros (0s) and ones (1s); if digital input signal 304 is in the $1^{st}$ range (i.e., between decimal 4 and 7, inclusive), then the sub-codes are made up of ones (1s) and twos (2s); if digital input signal 304 is in the $2^{rd}$ range (i.e., between decimal 8 and 11, inclusive), then the sub-codes are made up of twos (2s) and threes (3s); if digital input signal 304 is in the $3^{rd}$ range (i.e., between decimal 12 and 15, inclusive) then the sub-codes are made up of threes (3s) and fours (4s); and if digital input signal 304 is in the $4^{th}$ range (i.e., decimal 16), then the sub-codes are all equal to four (4). Combiner 406 determines the two possible values (e.g., one and two) of the sub-codes, based on range signal 410. Combiner 406 determines the ratio of these two values based on density signal 412. This will be explained with the following example.

Continuing with the example where digital input signal 304 equals binary 00101 (decimal 5), range signal 410 specifies that digital input signal 304 is within the $1^{st}$ range, and density signal 412 specifies a density of ¼th, as explained above. Because range signal 410 specifies that digital input signal 304 is within the $1^{st}$ range, combiner 406 knows that the sub-codes should be made up of ones (is) and twos (2s). Because density signal 412 specifies a density of ¼th, combiner 406 knows that one of the four sub-codes should be a two (2) and the remaining three sub-codes should be a one (1). Stated another way, density signal 412 specifies that ¼th of the sub-codes should have the higher of the two possible sub-code values, and that the remainder of the sub-codes should have the lower of the two possible sub-codes. Note that the sum of these sub-codes equals the value of digital input code (e.g., 2+1+1+1=5).

As mentioned above, for a given value of digital input code 304 (or for a given value of modulo signal 408), density generator 404 produces a pattern of possible density codes such that each density code occurs on average approximately the same number of times. This causes combiner 406 to produce a pattern of the various combinations for each value of digital input signal 304 such that each possible sub-code for each value of digital input signal 304 occurs, on average, approximately the same number of times. For example, if digital input signal 304 has a value of five, four times in a row, combiner 406 cycles through the possible sub-code outputs 2+1+1+1, 1+2+1+1, 1+1+2+1 and 1+1+1+2. Density generator 404 preferably produces the possible density codes in a pseudo random fashion so that the next four times digital input signal 304 equals five, the pattern occurs in a different order.

The patterns produces with the various sub-code combinations have the effect of averaging the error of each multi-bit sub-DAC, or equivalently moving the effect of the errors to out of band frequencies. The shufflers (310) mismatch shape each individual multi-bit sub-DAC so that the total effect is that substantially all errors are moved out of band.

IV. First Detailed Embodiment of Mismatch Shaping Network

A first implementation of mismatch shaping network 302 will now be described with reference to FIGS. 5–10.

A. Code Splitter and Code Shuffler

An exemplary embodiment of CSCS 306 (also referred to as splitter 306) shall now be described with reference to FIG. 5. In this description, the term "x<n>" refers to the $n^{th}$ bit of five bit digital input 304, wherein n=0, 1, 2, 3 or 4. x<4> represents the most significant bit (MSB). x<0> represents the least significant bit (LSB). The term x<2:0>, for example, refers to the $2^{nd}$ through $0^{th}$ bits.

In the drawings specifically, when a numeral describing a bus is in parentheses, e.g., (4), the numeral represents a number of bits in a density code. When a numeral describing a bus is not in parentheses, e.g., 4, then the number represents a number of bits in a binary code.

Figure 5:
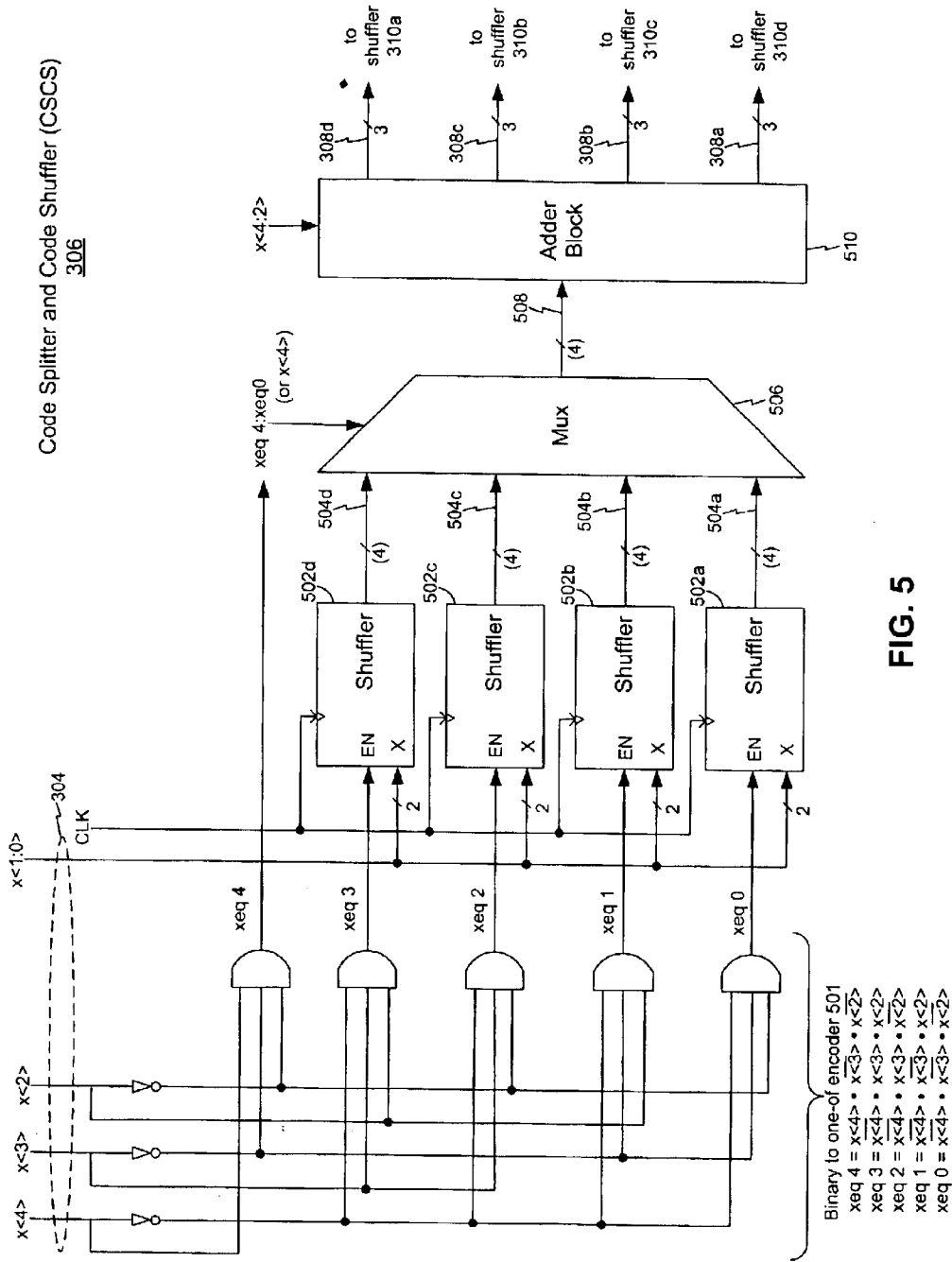
FIG. 5 is a block diagram that illustrates additional details of the code splitter and code shuffler of the mismatch shaping network in FIG. 3, according to an embodiment of the present invention.

In the embodiment shown in FIG. 5, CSCS 306 includes a binary to one-of encoder 501, four separate shufflers 502a, 502b, 502c and 502d, a multiplexor (MUX) 506, and an adder block 510. Each of these features will be explained below.

1. Binary-to-One Encoder

At the left of FIG. 5 is shown binary to one-of encoder 501 including five (5) AND gates. The inputs to binary to one-of encoder 501 are x<4>, x<3> and x<2> (also referenced as x<4:2>), which are the three (3) MSBs of digital input 304. The binary to one-of encoder 501 is an implementation of range selector 402 discussed above in connection with FIG. 4.

The "xeq" output of binary to one-of encoder 501 is an implementation of range signal 410, also discussed above in connection with FIG. 4. In this embodiment, the "xeq" output of binary to one-of encoder 501 is based on the decimal value of the three MSBs of binary digital signal 304. That is: when x<4:2> has a value 4, xeq4 is HIGH; when x<4:2> has a value 3, xeq3 is HIGH; when x<4:2> has a value 2, xeq2 is HIGH, when x<4:2> has a value 1. xeq1 is HIGH, and when x<4:2> has a value 0, xeq0 is HIGH.

More specifically, the output referred to as xeq0 is HIGH when x<4>, x<3> and x<2> are all LOW (i.e., xeq0=$\overline{x<4>}$·$\overline{x<3>}$·$\overline{x<2>}$). Referring to Table 1, x<4:2> equals binary 000 (i.e., xeq0 is HIGH), when input code 304 (i.e., x<4:0>) equals binary 00000 (i.e., 0), 00001 (i.e., 1), 00010 (i.e., 2), or 00011 (i.e., 3). Stated another way, xeq0 is HIGH when digital input signal 304 is within the $0^{th}$ range (0–3).

The output referred to as xeq1 is HIGH when x<4> and x<3> are LOW and x<2> is HIGH (i.e., xeq1=$\overline{x<4>}$·$\overline{x<3>}$·x<2>). Referring to Table 1, x<4:2> equals binary 001 (i.e., xeq1 is HIGH), when input code 304 (i.e., x<4:0>) equals binary 00100 (i.e., 4), 00101 (i.e., 5), 00110 (i.e. 6), or 00111 (i.e., 7). Stated another way, xeq1 is HIGH when digital input signal 304 is within the $1^{st}$ range (4–7).

The output referred to as xeq2, is HIGH when x<4> and x<2> are LOW and x<3> is HIGH (i.e., xeq2=$\overline{x<4>}$·x<3>·$\overline{x<2>}$). Referring to Table 1, x<4:2> equals binary 010 (i.e., xeq2 is HIGH), when input code 304 (i.e., x<4:0>) equals binary 01000 (i.e., 8), 01001 (i.e., 9), 01010 (i.e., 10), or 01011 (i.e., 11). Stated another way, xeq2 is HIGH when digital input signal 304 is within the $3^{rd}$ range (8–11).

The output referred to as xeq3 is HIGH when x<4> is LOW, and x<2> and x<3> are HIGH (i.e., xeq3=$\overline{x<4>}$·x<3>·x<2>). Referring to Table 1, x<4:2> equals binary 011 (i.e., xeq3 is HIGH), when input code 304 (i.e., x<4:0>) equals binary 01100 (i.e., 12), 01101 (i.e., 13), 01110 (i.e., 14), or 01111 (i.e., 15). Stated another way, xeq3 is HIGH when digital input signal 304 is within the $3^{rd}$ range (12–15).

The output referred to as xeq4 is HIGH when x<4> is high, and x<2> and x<3> are LOW (i.e. xeq4=x<4>·$\overline{x<3>}$·$\overline{x<2>}$). Referring to Table 1, x<4:2> equals binary 100 (i.e., xeq4 is HIGH), only when input code 304 (i.e., x<4:0>) equals binary 10000 (i.e., 16). Stated another way, xeq4 is HIGH when digital input signal 305 is within the $4^{th}$ range (16).

Binary to one-of encoder 501 enables only one of four (4) separate shufflers 502a, 502b, 502c and 502d at one time, because only one of xeq0, xeq1, xeq2 and xeq3 can be HIGH at one time. More specifically, shuffler 502a is enabled only when xeq0 is HIGH, and thus, when input code 304 (i.e., x<4:0>) equals binary 00000 (i.e., 0), 00001 (i.e., 1), 00010 (i.e., 2), or 00011 (i.e., 3), as explained above. Shuffler 502b is enabled only when xeq1 is HIGH, and thus, when input code 304 (i.e., x<4:0>) equals binary 00100 (i.e., 4), 00101 (i.e., 5), 00110 (i.e., 6), or 00111 (i.e., 7). Shuffler 502c is enabled only when xeq2 is HIGH, and thus, when input code 304 (i.e., x<4:0>) equals binary 01000 (i.e., 8), 01001 (i.e., 9), 01010 (i.e., 10), or 01011 (i.e., 11). Shuffler 502d is enabled only when xeq3 is HIGH, and thus, when input code 304 (i.e., x<4:0>) equals binary 01100 (i.e., 12), 01101 (i.e., 13), 01110 (i.e., 14), or 01111 (i.e., 15).

As mentioned above, when digital input 304 equals binary 10000 (i.e., the seventeenth level), all sixteen analog elements (represented by triangles) of multi-bit DAC 300 (FIG. 3) should be ON. When all sixteen analog elements are ON, no mismatch shaping of the elements is required. Accordingly, there is no need to associate a shuffler with xeq4, as is shown in FIG. 5. Stated another way, when xeq4 is HIGH, input code 304 (i.e., x<4:0>) equals binary 1000, and there is no need to enable a shuffler.

2. Shufflers of the Code Splitter and Code Shuffler

Figure 11:
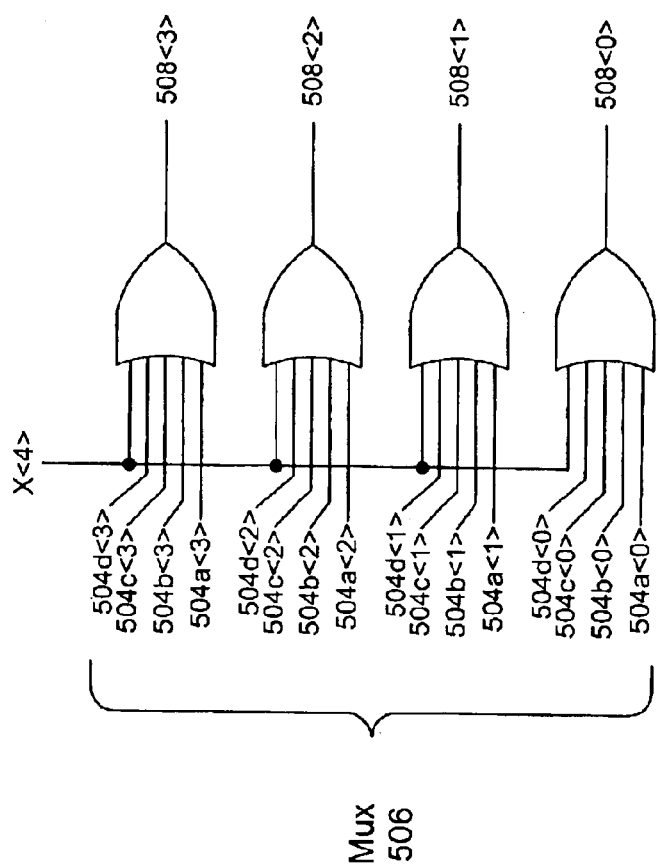
FIG. 11 is an implementation of the MUX shown in FIG. 5, according to an embodiment of the present invention.

In this exemplary embodiment, each shuffler 502a, 502b, 502c and 502d, when enabled, shuffles the value represented by the two LSBs x<1:0> of digital input 304, and outputs a respective four bit shuffled density code (not a binary word) 504a, 504b, 504c and 504d. Based on which of xeq3:xeq0 is HIGH, MUX 506 provides a four bit shuffled density code 504a, 504b, 504c or 504d to Adder block 510 as four bit density code 508. If each shuffler 502a, 502b, 502c and 502d is designed such that its output is LOW when it is not enabled, then MUX 506 can be replaced with four OR gates, as shown in FIG. 11 (with the outputs of the four OR gates making up four bit density code 508). Collectively, shufflers 502a, 502b, 502c and 502d together with MUX 506 (e.g., made up of four OR gates) are an implementation of density generator 404, discussed above in connection with FIG. 4. Accordingly, four bit density code 508 is an implementation of density signal 412, also discussed above in connection with FIG. 4.

Adder block 510, based in part on which of xeq4:xeq0 is HIGH, outputs sub-codes 308a, 308b, 308c and 308d as four (4) separate three (3) bit binary outputs (that are provided to shufflers 310a, 310b, 310c, 310d, as shown in FIG. 3). Outputs 308a, 308b, 308c and 308d are based in part on four bit density code 508 when one of xeq3:xeq0 is HIGH. However, when xeq4 is HIGH (which only happens when digital input 304 equals binary 10000), each three bit binary output 308a, 308b, 308c and 308d equals binary 100 (decimal 4). As mentioned above, the sum of the four sub-codes 308a, 308b, 308c and 308d is equal to digital input code 304. Additionally, as mentioned above, input code 304 is as equitably split as possible into the four sub-codes 308a, 308b, 308c and 308d. Adder block 510 is an implementation of combiner 406, discussed above in connection with FIG. 4. Adder block 510 is discussed in more detail below with reference to FIG. 9.

The shufflers 502a, 502b, 502c and 502d of code splitter 306 shall be described with reference to FIG. 6. Referring back to FIG. 5, shuffler 502a is enabled when xeq0 is HIGH, shuffler 502b is enabled when xeq1 is HIGH, shuffler 502c is enabled when xeq2 is HIGH, and shuffler 502c is enabled when xeq3 is HIGH. Each shuffler 502a, 502b, 502c and 502d is essentially the same, and thus, shall be described generically, with reference to FIG. 6, as shuffler 502.

Figure 6:
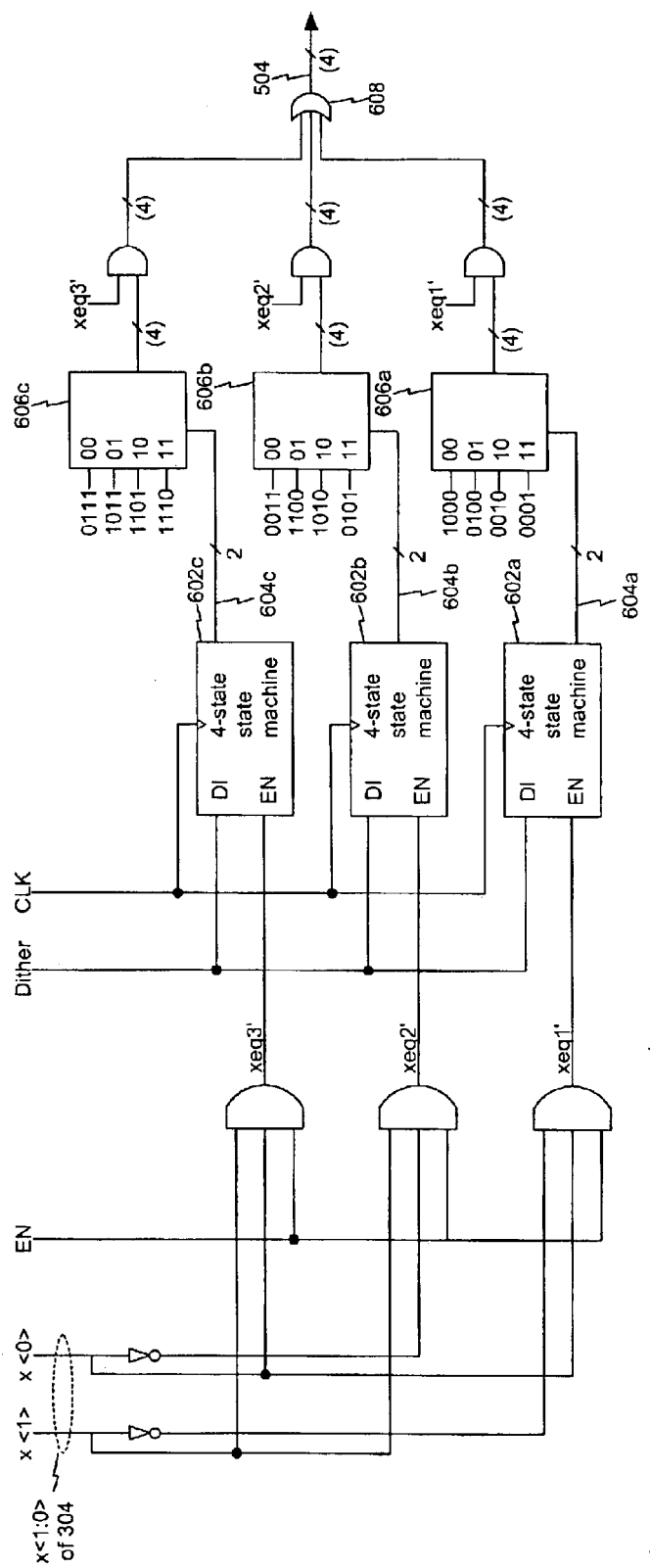
FIG. 6 is a block diagram that illustrates additional details of the shufflers of the code splitter and code shuffler in FIG. 5, according to an embodiment of the present invention.

At the left of FIG. 6 is shown a binary to one-of encoder 601 including three (3) AND gates. The inputs to binary to one-of encoder 601 are x<1> and x<0> (also references as x<1:0>), which are the two LSBs of digital input signal 304, and EN (enable). The "xeq'" output of binary to-one encoder 601 is based on the decimal value of the two LSBs of digital input signal 304. More specifically, the output referred to as xeq3' is HIGH when x<1> and x<0> are HIGH; the output referred to as xeq2' is HIGH when x<1> is HIGH and x<0> is LOW; and the output referred to as xeq1' is HIGH when x<1> LOW and x<0> is HIGH. That is: when x<1:0> has a value 3 (i.e., binary 11), xeq3' is HIGH; when x<1:0> has a value 2 (i.e., binary 10), xeq2' is HIGH; and when x<1:0> has a value 1 (i.e., binary 01), xeq1' is HIGH. When x<1:0> has a value of 0 (i.e., binary 00), then the output 504 of shuffler 502 will be zero (i.e., 4 bit density code 0000).

Binary to one-of encoder 601 enables one of three (3) separate four-state state machines 602a, 602b and 602c (also referred to simply as "state machines"). Only one of the four-state state machines is enabled at one time, because only one of xeq1', xeq2' and xeq3' can be HIGH at one time.

Each state machine 602a, 602b and 602c, when enabled, outputs a respective two bit binary word 604a, 604b and 604d that is representative of one of four possible states (i.e., binary 00, 01, 10 and 11). The state machines are designed such that they cycle through the four possible states so that each state appears at the output of a specific state machine (e.g., state machine 602a) once every four times that particular state machine is enabled. Each state machine utilizes a pseudo random dither code such that it cycles through the four possible states in a pseudo random manner. Additional details of an exemplary embodiment of the state machines 602a, 602b and 602c are described with reference to FIGS. 7 and 8.

Each two-bit binary word 604a, 604b, or 604c, is used to select one of four different four bit shuffled density codes from a respective RAM 606a, 606b and 606c.

When xeq3' is HIGH, state machine 602c selects one of the four possible density code outputs 0111, 1011, 1101, and 1110 (not binary) that can be selected from RAM 606c. Each of these outputs has a density of ¾th. Referring to Table 1, x<1:0> equals binary 11 (i.e., xeq3' is HIGH) when input code 304 (i.e., x<4:0>) equals binary 01111 (i.e., 15), 01011 (i.e., 11), 00111 (i.e., 7), or 00011 (i.e., 3). As shown in Table 1, there are four possible combinations associated with each of these input codes 304. As also shown in Table 1, the sub-code set for each of these input codes 304 includes three of the higher value sub-codes and one of the lower value sub-codes.

When xeq2' is HIGH, state machine 602b selects one of the four possible density code outputs 0011, 1100, 1010, and 0101 (not binary) that can be selected from RAM 606b. Each of these outputs has a density of ²⁄₄th. Referring to Table 1, x<1:0> equals binary 10 (i.e., xeq2' is HIGH) when input code 304 (i.e., x<4:0>) equals binary 01110 (i.e., 14), 01010 (i.e., 10), 00110 (i.e., 6), or 00010 (i.e., 2). As shown in Table 1, there are six possible combinations associated with each of these input codes 304. As mentioned above, the inventors have determined that for each of these input codes 304, sufficient mismatch shaping performance is achieved using just four of the six possible combinations, or using just two of the six possible combinations. State machine 602b selects one of four outputs rather than selecting one of six outputs or selecting one of two outputs, because this results in a convenient implementation. An implementation choosing one of four outputs enables the use of an identical state machine implementation for state machine 602b as that used for state machines 602a and 602c. One of ordinary skill in the art would appreciate from the description herein how to modify state machine 602b so that it selects one of six outputs or so that it selects one of two outputs. As shown in Table 1, the sub-code set for each of these input codes 304 includes two of the higher value sub-codes and two of the lower value sub-codes.

When xeq1' is HIGH, state machine 602a selects one of the four possible density code outputs 0001, 0010, 0100, and 1000 (not binary) that can be selected from RAM 606a. Each of these outputs has a density of ¼th. Referring to Table 1, x<1:0> equals binary 01 (i.e., xeq1' is HIGH) when input code 304 (i.e., x<4:0>) equals binary 01101 (i.e., 13), 01001 (i.e., 9), 00101 (i.e., 5), or 00001 (i.e., 1). As shown in Table 1, there are four possible combinations associated with each of these input codes 304. As also shown in Table 1, the sub-code set for each of these input codes 304 includes one of the higher value sub-codes and three of the lower value sub-codes.

As shown at the right of FIG. 6, one of the twelve possible density codes are output from an OR gate 608 as four bit density code (not a binary word) 504, based on x<0:1> and the enabled state machine. One of ordinary skill in the art will understand that OR gate 608 is actually implemented using four OR gates. Similarly, each of the three AND gates shown at the right in FIG. 6 are implemented using four AND gates. These logic gates are shown as they are to avoid unnecessary clutter in the figures.

When x<0> and x<1> are both LOW (i.e., when the two LSBs x<1:0> equals binary 00), then the four bit shuffled density code 504 equals 0000 (not binary). Referring to Table 1, x<1:0>equals binary 00 when input code 304 (i.e. x<4:0>) equals binary 10000 (i.e., 16), 01100 (i.e., 12), 01000 (i.e., 8), 00100 (i.e., 4), or 00000 (i.e., 0). As mentioned above, when x<1:0> equals binary 00 output code 504 equals 0000 (density code). As shown in Table 1, there is only one possible combination associated with each of these input codes 304. As also shown in Table 1, the sub-code set for each of these input codes 304 includes only the lower value of the two possible values for the corresponding range.

3. Four-State State Machines

Each of the shufflers 502a, 502b, 502c and 502d of CSCS 306 are shown as being implemented using three separate 4-state state machines 602a, 602b, 602c. As will be explained below, shufflers 302a, 302b, 302c and 302d can also be implemented using 4-state state machines. Accordingly, the exemplary embodiment of a 4-state state machine (also simply referred to as a "state machine") explained with reference to FIGS. 7 and 8 can be used in shufflers 502a, 502b, 502c, 502d and/or shufflers 302a, 302b, 302c, 302d.

Referring back to FIG. 6, each state machine (e.g., 602a, 602b. 602c) receives an enable (EN) signal and a pseudo random dither signal (DI), and outputs a two bit binary signal (e.g., 604a, 604b, 604c) that is one of four states (i.e., 00, 01, 10 and 11). As mentioned above, the state machines are preferably designed such that they produce a pattern of the four possible states in a pseudo random manner such that, on average, each of the four states occurs approximately the same number of times.

The exemplary state machine outputs a next state based: on a previous state; a pseudo random dither signal (also simply referred to as a dither signal); and a variable that shall be referred to a toggling pass signal. The next or previous state can be either 00, 01, 10 or 11. If, for example, the state is 01, then most significant bit (MSB) of the state is 0, and the least significant bit (LSB) he state is 1. Table 2 is a state table for an exemplary state machine (e.g., , 602b, 602c).

TABLE 2

Four-State State Table

| State | | | | Next State | | next |
|---|---|---|---|---|---|---|
| MSB | LSB | pass | Dither | MSB | LSB | pass |
| 0 | 0 | 0 | X | 0 | 1 | 1 |
| 0 | 0 | 1 | 0 | 1 | 0 | 0 |
| 0 | 0 | 1 | 1 | 1 | 1 | 0 |
| 0 | 1 | 0 | X | 0 | 0 | 1 |
| 0 | 1 | 1 | 0 | 1 | 0 | 0 |
| 0 | 1 | 1 | 1 | 1 | 1 | 0 |
| 1 | 0 | 0 | X | 1 | 1 | 1 |
| 1 | 0 | 1 | 0 | 0 | 0 | 0 |
| 1 | 0 | 1 | 1 | 0 | 1 | 0 |
| 1 | 1 | 0 | X | 1 | 0 | 1 |
| 1 | 1 | 1 | 0 | 0 | 0 | 0 |
| 1 | 1 | 1 | 1 | 0 | 1 | 0 |

Figure 7:
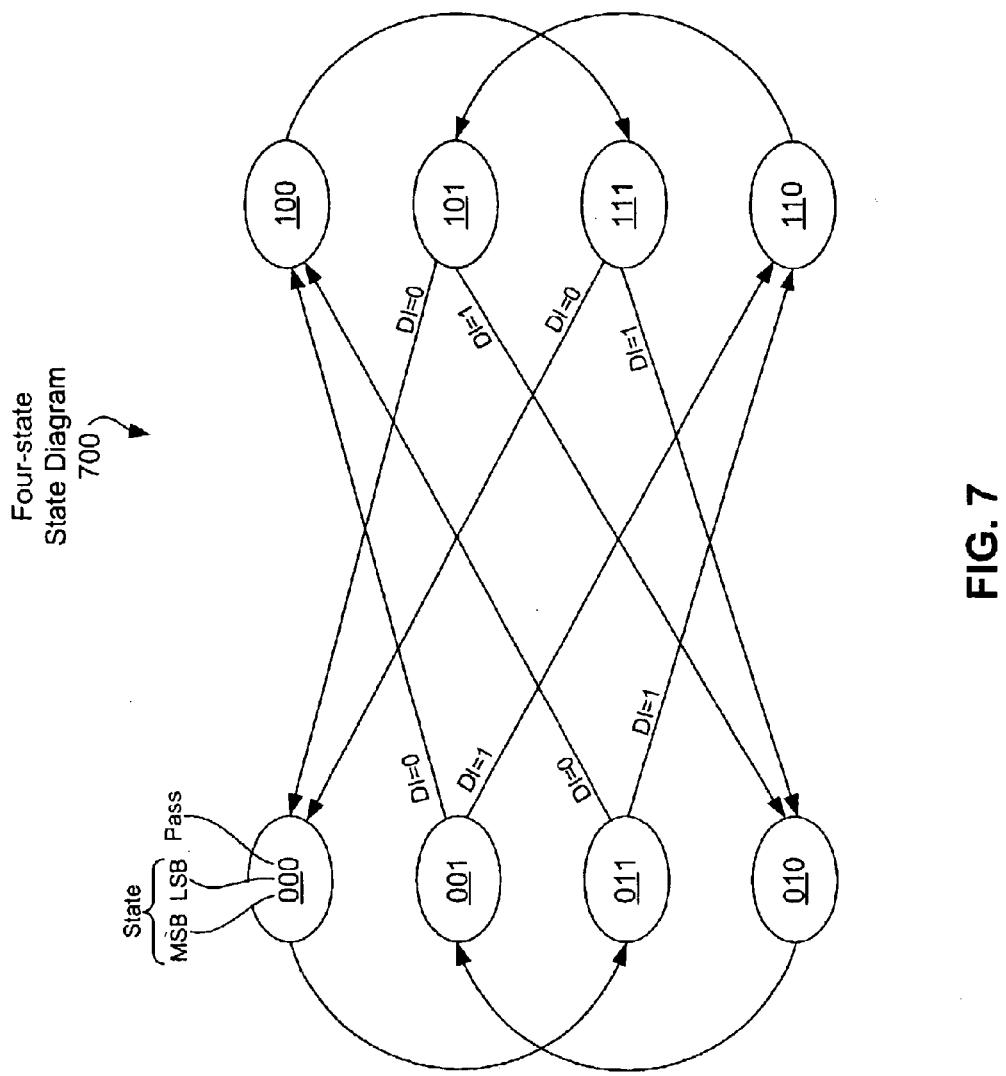
FIG. 7 is a state diagram that is useful for explaining the state machines of the shufflers in FIG. 6, according to an embodiment of the present invention.
Figure 8:
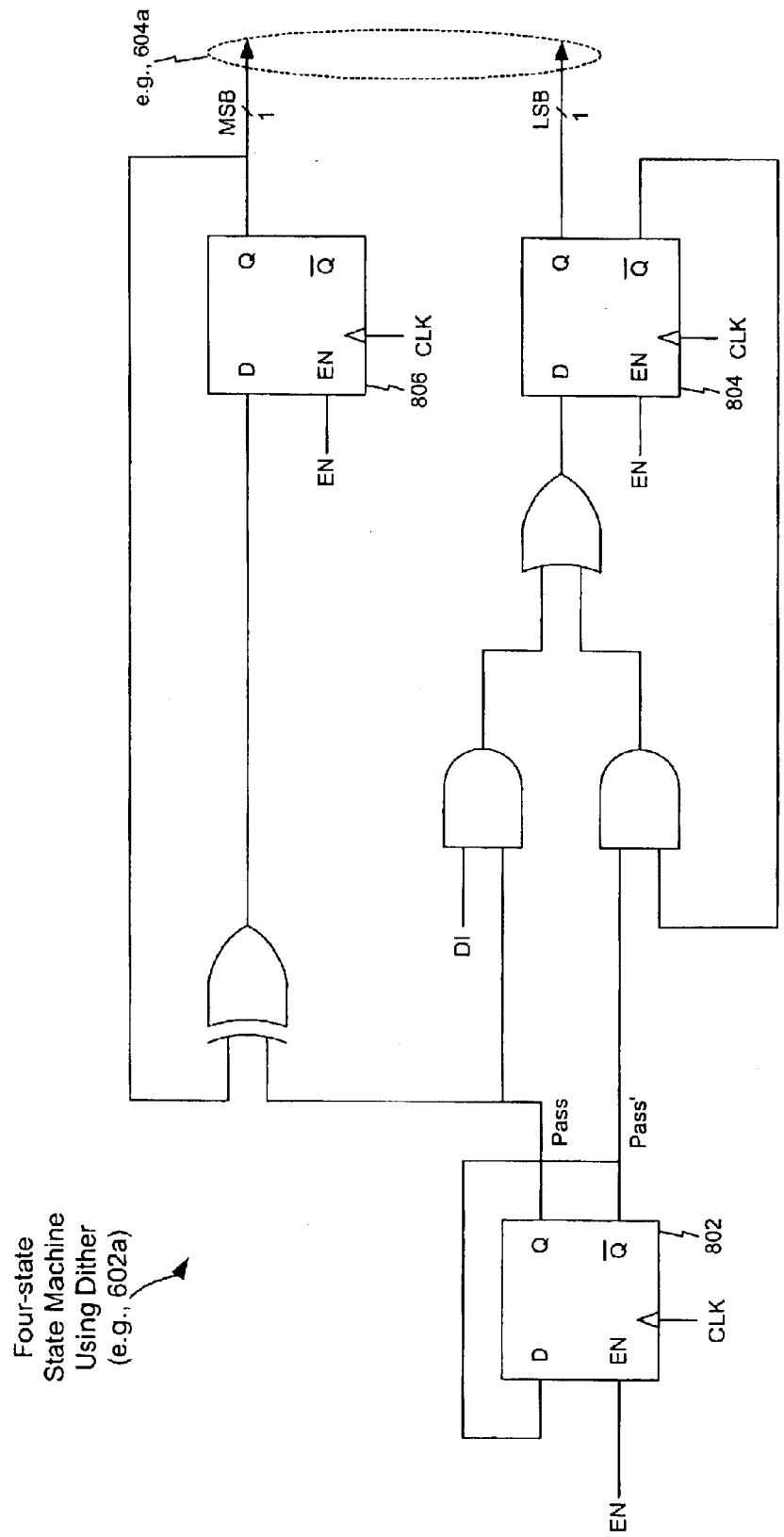
FIG. 8 is a block diagram of a state machine of the shuffler in FIG. 6, according to an embodiment of the present invention.

FIG. 7 is a state diagram 700 that is consistent with the state table of Table 2. FIG. 8 shows an exemplary circuit of a four state state machine (e.g., 602a) that implements state diagram 700 (and thus, the state table of Table 2). As shown, the state machine of FIG. 8 is implemented using three flip flops 802, 804 and 806, two AND gates, an OR gate, and an exclusive OR gate. One of ordinary skill in the art would understand how this circuit implements the state diagram 700 shown in FIG. 7. One of ordinary skill in the art would also appreciate that other equivalent circuit diagrams can be used to implement the state table of Table 2.

The above discussed state table, diagram, and circuit has been provided as an example that is not meant to be limiting. One of ordinary skill in the art would understand that alternative systems and methods for producing patterns of multiple states (e.g., four states) can be used while still being with in the spirit and scope of the present invention.

Provided above is an exemplary embodiment of the shufflers 502a, 502b, 502c and 502d. One of ordinary skill in the art will appreciate that alternative four-term dynamic gain mismatch shaping encoders can be used in place of the above described shufflers 502a, 502b, 502c and 502d, while still being within the spirit and scope of the present invention.

4. Adder Block

Referring back to FIG. 5, Adder block 510 receives a density code 508 from MUX 506, when one of xeq3:xeq0 is HIGH. When xeq4 is LOW, density code 508 is equal to one of 504a, 504b, 504c and 504d, depending on which of xeq3:xeq0 is HIGH. Based on density code 508, Adder block 510 outputs four (4) separate binary sub-codes 308a, 308b, 308c and 308d, the sum of which equals digital input code 304. When xeq4 is HIGH, adder block 510 outputs four binary sub-codes 504a, 504b, 504c and 504d all having a value of four (i.e., binary 100).

As mentioned above, sub-codes 308a, 308b, 308c and 308d differ from each other by no more than one level. For example, if 304 has a value of fifteen (i.e., binary 0111), then three of the four binary sub-codes will have a value of four (i.e., binary 100), and one of the four binary sub-codes will have a value of three (i.e., binary 011), as shown in Table 1. Continuing with the example where 304 has a value of fifteen (i.e., binary 01111), it is shuffled density code 508 that specifies which three of sub-codes 308a, 308b, 308c and 308d are equal to four (i.e., binary 100), and which one of the sub-codes is equal to three (i.e., binary 011).

Figure 9:
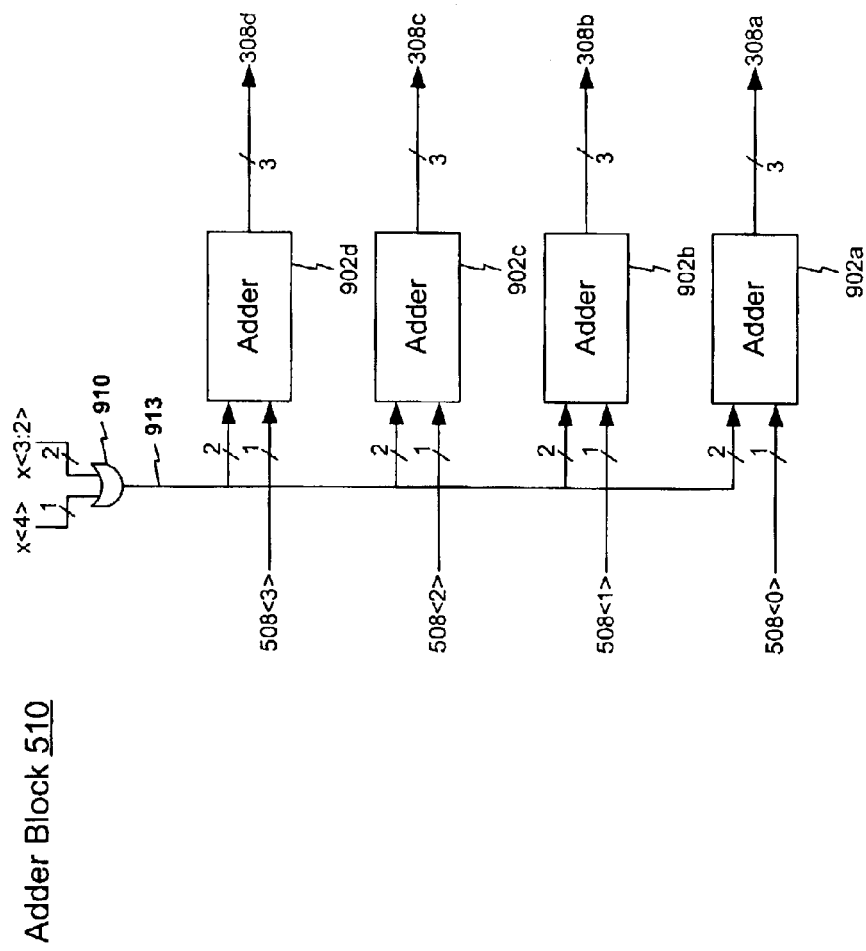
FIG. 9 is a block diagram of the adder block of the code splitter and code shuffler in FIG. 5, according to an embodiment of the present invention.
Figure 12:
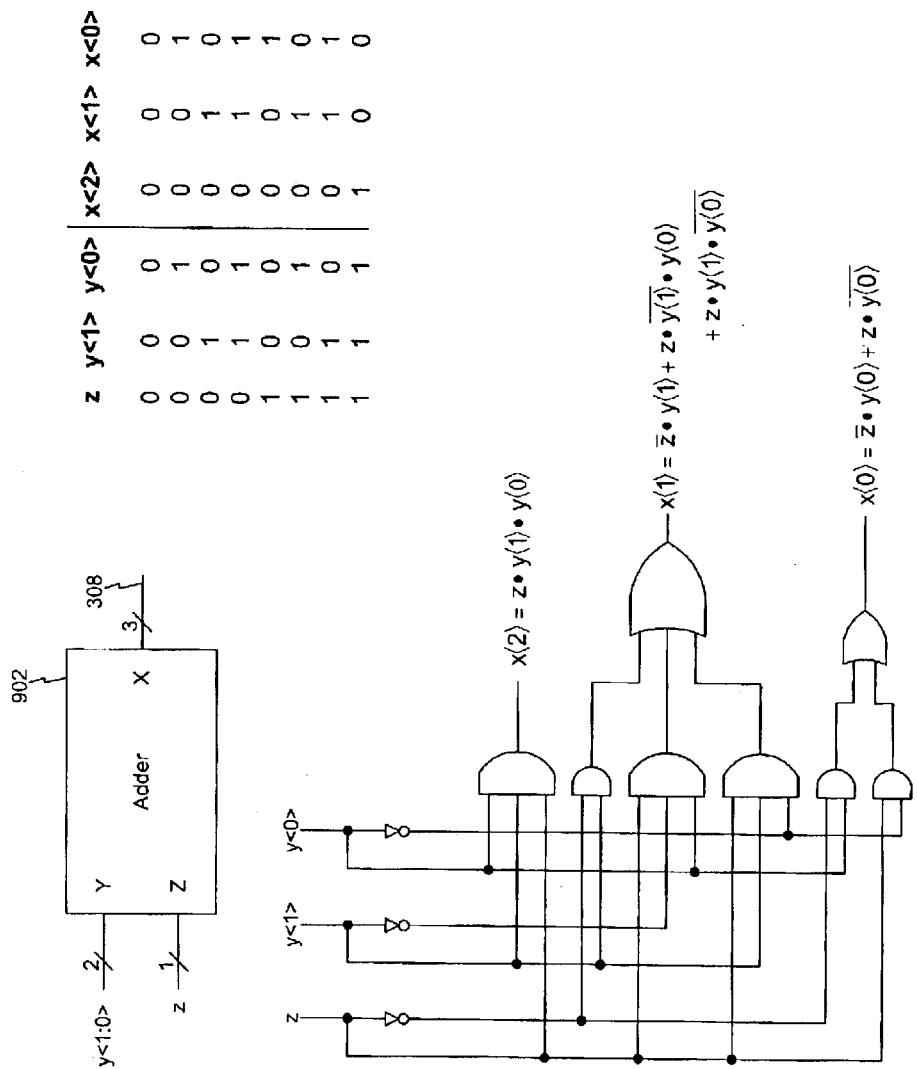
FIG. 12 illustrates an exemplary implementation of an adder that can be used in various embodiments of the present invention.

An exemplary implementation of adder block 510 is shown in FIG. 9. Referring to FIG. 9, adder block 510 includes adders 902a, 902b, 902c and 902d. OR gate 910 passes forward a two bit code 913, which identical to two-bit code x<3:2>, when x<4> is LOW. OR gate 910 passes forward a two bit code 913 consisting of bits "1", when x<4> is HIGH. Each adder 902a, 902b, 902c and 902d adds the two bits x<3:2> (or "111" if x<4> is a "1" bit) to a respective one of the bits of 4 bit density code 508 (i.e., to 508<0>, 508<1>, 508<2> and 508<3>, respectively) to produce sub-codes 308a, 308b, 308c and 308d. An exemplary implementation of adders 902 is shown in FIG. 12.

5. MUX

FIG. 11 is an implementation of MUX 506 of FIG. 5, according to an embodiment of the present invention. Four separate 4 bit shuffled density codes 504a, 504b, 504c and 504d are received at the input of MUX 506. Referring to FIG. 5, only one of the four shufflers 502a, 502b, 502c and 502d can be enabled at the same time. Therefore, only one of the four 4 bit signals 504a, 504b. 504c and 504d at the output of the shufflers can be non-zero, while the other three 4 bit signals are all equal to "0000". OR gates 1105a, 1105b, 1105c and 1105d select the non-zero shuffled density code signal received at the input of MUX 506 from among all four of the shuffled density code signals 504a, 504b, 504c and 504d. When x<4> is LOW, OR gates 1105a, 1105b, 1105c and 1105d pass forward a 4 bit shuffled density code 508<0>, 508<1>, 508<2> and 508<3>, which is equal to the non-zero shuffled density code signal received at the input of MUX 506. When x<4> is HIGH, OR gates 1105a, 1105b, 1105c and 1105d pass forward a 4 bit density code equal to "1111".

B. Shufflers of Mismatch Shaping Network

As described above, CSCS 306 generates four separate sub-codes 308a, 308b, 308c and 308d from digital input code 304 (e.g., splits each digital input code 304 into four separate sub-codes 308a, 308b, 308c and 308d), the sum of which equal input code 304. Also, as described above, the four sub-codes 308a, 308b, 308c and 308d preferably differ from one another by no more than one level (i.e., input code 304 is preferably split as equitably as possible into the four sub-codes 308a, 308b, 308c and 308d). For each digital input code 304 having the same distinct level, CSCS 306 produces a set of the four sub-codes 308a, 308b, 308c, and 308d that may have one of a plurality of different sub-code orders with respect to each other. For example, if digital input code 304 represents a distinct level of 13, then the members of the set of sub-codes are 3 3, 3, and 4. There are four possible sub-code orders of these sub-code members. These are: 3,3,3,4; 3,3,4,3; 3,4,3,3; and 4,3,3,3. The sub-code members in these four sets are equivalent (i.e. 3 sub-code members equal to 3 and one sub-code member equal to 4), but the order for each set is different. The selection of the sub-code order for each digital input code 304 having the same distinct level (e.g. 13) is preferably based upon a combination of a digital code stored in one or memory elements and a digital pseudo-random code. The digital code, e.g., stored in one or more memory elements, provides information about one or more previously selected sets of the sub-codes provided by CSCS 306. Selection of the sub-code order, based on a digital code stored in one or more memory elements or based upon a digital pseudo-random code, is referred to hereafter as code shuffling. As described above, sub-code 308a, 308b, 308c, and 308d are preferably passed to each of multiple shufflers 310a, 310b, 310c, and 310d. These shufflers produce output digital density signals 311a, 311b, 311c, and 311d in which the order of the ones and zeros in each output digital density signal is not correlated to the levels represented with each of the sub-codes. An exemplary embodiment of shufflers 310a, 310b, 310c, and 310d shall now be described with reference to FIG. 10. Each shuffler 310a, 310b, 310c, and 310d is essentially the same, and thus, shall be described generically as shuffler 310.

Figure 10:
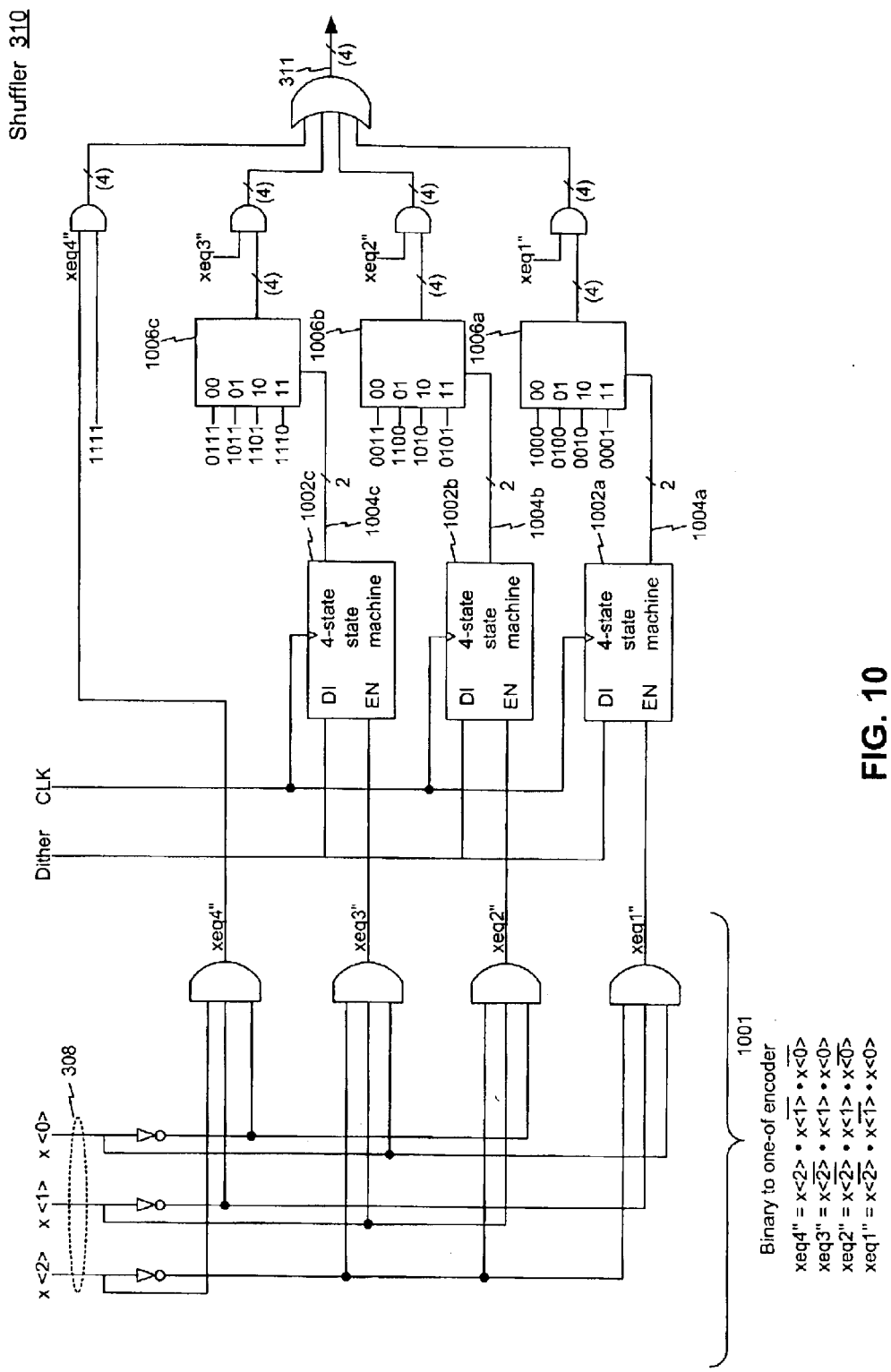
FIG. 10 is a block diagram that illustrates additional details of the shufflers of the mismatch shaping network in FIG. 3.

At the left of FIG. 10 is shown a binary to one-of encoder 1001 including four (4) AND gates. The inputs to binary to one-of encoder 1001 are x<2>, x<1> and x<0> (which are the three (3) LSBs of digital input 304). The "xeq"" output of binary to-one encoder 1001 is based on the value of the binary input of the three LSBs of digital signal 304. More specifically, the output referred to as xeq4" is HIGH when x<2> is HIGH, and x<1> and x<0> are LOW; the output referred to as xeq3" is HIGH when x<2> is LOW, and x<1> and x<0> are HIGH; the output referred to as xeq2" is HIGH when x<2> and x<0> are LOW, and x<1> is HIGH; and the output referred to as xeq1" is HIGH when x<2> and x<1> are LOW, and x<0> is HIGH.

Binary to one-of encoder 1001 enables one of three (3) separate four-state state machines 1002a, 1002b and 1002c (also referred to simply as "state machines"). Only one of the state machines is enabled at one time., because only one of xeq1", xeq2" and xeq3" can be HIGH at one time. xeq4" is only HIGH when digital input 304 equals binary 10000, which means all sixteen analog elements should be ON. When all sixteen analog elements are ON, no mismatch shaping of the elements is required.

Each state machine 1002a, 1002b and 1002c, when enabled, outputs a respective two bit binary word 1004a, 1004b and 1004d that is representative of one of four possible states (i.e., 00, 01, 10 and 11). The state machines are designed to produce patterns of the four possible states, preferably in a pseudo random manner, such that each state occurs on average at the output of a specific state machine once every four times that particular state machine is enabled. State machines 1002a, 1002b and 1002c are similar to (and can even be identical to) state machines 602a, 602b and 602c. Details of an exemplary embodiment of a state machine have been discussed above with reference to FIGS. 7 and 8.

Each two-bit binary word 1004a, 1004b, or 1004c, is used to select one of four different four bit shuffled density codes from a respective RAM 1006a, 1006b or 1006c.

The four possible density code outputs 0111, 1011, 1101, and 1110 that can be selected from RAM 1006c each have a shuffled density code of ¾th. One of these outputs are selected when state machine 1002c is enabled by xeq3" being HIGH. Referring to Table 1, x<2:0> equals binary 011 (i.e., xeq3" is HIGH), for example, when input code 304 (i.e., x<4:0>) equals binary 01011 (i.e., 11) or 00011 (i.e., 3).

The four possible density code outputs 0011, 1100, 1010, and 0101 that can be selected from RAM 1006b each have a shuffled density code of 2/4th. One of these outputs are selected when state machine 1002b is enabled by xeq2" being HIGH. Referring to Table 1, x<2:0> equals binary 010 (i.e., xeq2" is HIGH), for example, when input code 304 (i.e. x<4:0>) equals binary 01010 (i.e., 10) or 00010 (i.e., 2).

The four possible density code outputs 0001, 0010, 0100, and 1000 that can be selected from RAM 1006a each have a shuffled density code of ¼th. One of these outputs are selected when state machine 1002a is enabled by xeq1" being HIGH. Referring to Table 1, x<2:0> equals binary 001 (i.e., xeq1" is HIGH), for example, when input code 304 (i.e., x<4:0>) equals binary 01001 (i.e., 9) or 00001 (i.e. 1).

As shown, when xeq4" is HIGH, the density code output is always 1111, having a shuffled density code of 4/4th (i.e., 1). Referring to Table 1, x<2:0> equals binary 100 (i.e., xeq4" is HIGH) when input code 304 (i.e., x<4:0>) equals binary 01100 (i.e., 12) or 00100 (i.e., 4).

As shown at the right of FIG. 10, one of the thirteen possible shuffled density codes are output from an OR gate (actually implemented as four OR gates) as four bit shuffled density code (not a binary word) 311. When x<2:0> equals binary 000 (i.e., 0), then four bit density code 311 is equal to 0000. Referring back to FIG. 3, four bit shuffled density code 311 is provided to a 4 element sub-DAC 312.

Provided above is an exemplary embodiment of the shufflers 310a, 310b, 310c and 310d. One of ordinary skill in the art will appreciate that alternative dynamic element mismatch shaping encoders can be used in place of the above described shufflers 310a, 310b, 310c and 310d, while still being within the spirit and scope of the present invention.

Shufflers 502a, 502b, 502c, 502d and/or shufflers 302a, 302b, 302c, 302d may also be implemented using many different dynamic element matching (DEM) structures, and should not be limited to the specific implementations of FIG. 6 and FIG. 10. For example, any of the dynamic element mismatching structures described in the following patents, each of which is incorporated by reference, may be used to implement Shuffler 1310: U.S. Pat. No. 5,404,142 (Adams et al.), entitled "Data-Directed Scrambler For Multi-Bit Noise Shaping D/A Converters"; U.S. Pat. No. 5,406,283 (Leung), entitled "Multi-bit Oversampled DAC with Dynamic Element Matching"; U.S. Pat. No. 5,684,482 (Galton), entitled "Spectral Shaping of Circuit Errors In Digital-to-Analog Converters; and U.S. Pat. No. 5,221,926 (Jackson), entitled "Circuit and Method for Cancelling Nonlinearity Error Associated with Component Value Mismatches in a Data Converter". Other possible dynamic element mismatch shaping structures that can be used with the present invention, include, but are not limited to, those disclosed in the following references, each of which are incorporated herein by reference: Sehreier "An empirical study of high-order, single-bit delta sigma modulators," *IEEE Trans. on Circuits and Sys. II: Analog and Digital Sig. Proc.*, vol. 40, no. 8, pp. 461–466, August 1993; Carley et al., "A 16 bit order noise-shaping D/A converter, *IEEE Proc. CICC*, pp. 21.7.1–21.7.4 1988; Baird el al. "Improved ΣΔ DAC linearity using data weighted averaging," Proceedings of the IEEE International Symposium on Circuits and Systems, May, 1995; Baird et al., Linearity enhancement of multi-bit ΣΔ A/D and D/A converters using data weighted averaging," IEEE Trans. on Circuits and Systems II: Analog and Digital Signal Processing, vol. 42, no. 12, pp. 753–762, December 1995. One of ordinary skill in the art will appreciate how any of these DEM structures may be used to implement Shuffler 310*am* 310*b*, 310*c*, 310*d*, and 1310.

C. Summary of First Embodiment

The above described embodiment of mismatch shaping network 302 shall now be summarized and also explained with a few examples.

Referring back to FIGS. 3 and 5, code splitter 306 includes four code shufflers 502*a*, 502*b*, 502*c* and 502*d*. Based on the three MSBs of input code 304, code splitter 306 can determine whether the input code 304 has a value between 0 and 3 inclusive (i.e., 0–3), 4–7, 8–11, 12–15 or has a value of 16. Code splitter 306 accomplishes that by determining which of the four shufflers 502*a*, 502*b*, 502*c* and 502*d* should be enabled based on the three MSBs of input code 304.

More specifically, if 304 has a value 0–3, then xeq0 is HIGH, and shuffler 502*a* is enabled. When this occurs, each of the four sub-codes 308*a*, 308*b*, 308*c* and 308*d* will have a value of 0 (binary 000) or 1 (binary 001).

If 304 has a value 4–7, then xeq1 is HIGH, and shuffler 502*b* is enabled. When this occurs, each of the four sub-codes 308*a*, 308*b*, 308*c* and 308*d* will have a value of 1 (binary 001) or 2 (binary 010).

If 304 has a value 8–11, then xeq2 is HIGH, and shuffler 502*c* is enabled. When this occurs, each of the four sub-codes sub-codes 308*a*, 308*b*, 308*c* and 308*d* will have a value of 2 (binary 010) or 3 (binary 011).

If 304 has a value 12–15, then xeq3 is HIGH, and shuffler 502*d* is enabled. When this occurs, each of the four sub-codes sub-codes 308*a*, 308*b*, 308*c* and 308*d* will have a value of 3 (binary 011) or 4 (binary 100).

Further, if 304 has a value 16, then xeq4 is HIGH, and each of the four sub-codes 308*a*, 308*b*, 308*c* and 308*d* will have a value of 4 (binary 100).

This description immediately above is summarized by Table 1.

Each four term-shuffler, which includes multiple four-state state machines, outputs a four bit density code based on the two LSBs of input code 304. Each density code has a density of either 0/4th, 1/4th, 2/4th or 3/4th. The four bit density code defines how many of the four sub-codes should have a first value (e.g., 0) and how many should have a second value (e.g. 1).

For example, if 304 has a value 0–3, and thus xeq0 is HIGH and shuffler 502*a* is enabled, then the four bit density code output from shuffler 502*a* defines how many of the four sub-codes should have a value of 0 (binary 000) or a value of 1 (binary 001). Remember, when the sub-codes are added up they will equal the input code 304.

In a more specific example, if input code 304 has a value 3 (binary 00011), then xeq0 is HIGH, and shuffler 502*a* is enabled. As explained above, when 304 has a value 0–3 (i.e., within the $0^{th}$ range), each of the four sub-codes 308*a*, 308*b*, 308*c* and 308*d* will have a value of 1 (binary 001) or 0 (binary 000). Shuffler 502*a*, based on the two LSBs of input code 304 outputs a density code 504*a*. The two LSBs of binary 00011 are binary 11. Referring to FIG. 6 (which shows an exemplary embodiment of four term shufflers 502 in detail), when the two LSBs are binary 11, xeq3' is HIGH, causing four-state state machine 602*c* to be enabled. Four state—state machine 602*c* selects one of four density codes that all have a density of 3/4th, which means three out of the four sub-codes should have a value of 1 (binary 001) and the remaining one of the four sub-codes should have a value of 0 (binary 000). The four bit density code having a density of 3/4th can be 0111, 1011, 1101 or 1110. The selection of one of the four density codes is based on previous density codes output when 304 had a value 3, and based on a pseudo random dither code.

In another example, digital input code 304 has a value of 10 (binary 01010). Thus, 304 has a value 8–11 (i.e., is within the $2^{nd}$ range), xeq2 is HIGH, and shuffler 502*c* is enabled. As explained above, when digital input code 304 has a value 8–11, each of the four sub-codes 308*a*, 308*b*, 308*c* and 308*d* will have a value of 2 (binary 010) or 3 (binary 011). The four bit density code 504*c* output from shuffler 502*c* defines how many of the four sub-codes have a value of 3 (binary 011) and how many have a value of 2 (binary 010). For a value of 10 (binary 01010), the four bit density code 504*c* will have a density of 2/4th, which means two of the four sub-codes should have a value of 3 (binary 011) and two of the four sub-codes should have a value of 2 (binary 010). The four bit density code having a density of 2/4th can be 0011, 1100, 1010 or 0101. The selection of one of the four density codes is based on previous density codes output when 304 had a value 10, and based on a pseudo random dither code.

Referring specifically to FIG. 5, the four bit density code output from one of shufflers 502*a*, 502*b*, 502*c* or 502*d* (or the four bit density code 1111 if 304 has a value of 16) is provided to Adder block 510 as density code 508. Based on the four bit density code 508, and the three MSBs of input code 304, Adder block 510 outputs four separate 3 bit binary sub-codes 308*a*, 308*b*, 308*c* and 308*d*, the sum of which equal input code 304.

Referring back to FIG. 3, each of the four sub-codes 308*a*, 308*b*, 308*c* and 308*d* are provided to a respective one of shufflers 310*a*, 310*b*, 310*c* and 310*d*. Continuing with the example where input code 304 has a value of 10, two of the four shufflers 310*a*, 310*b*, 310*c* and 310*d* will receive a sub-code having a value of 3 (i.e., binary 011) and two of the four shufflers 310*a*, 310*b*, 310*c* and 310*d* will receive a sub-code having a value of 2 (i.e., binary 010).

Each shuffler 310*a*, 310*b*, 310*c* and 310*d*, which has been explained with reference to FIG. 10, will output a respective shuffled density code 311*a*, 311*b*, 311*c* and 311*d*, each of which drives a respective four element sub-DAC 312*a*, 312*b*, 312*c* and 312*d*. Each shuffled density code 311*a*, 311*b*, 311*c* and 311*d* has a density of 0/4th (i.e., 0), 1/4th, 2/4th, 3/4th, or 4/4th (i.e., 1), depending on the value of the respective sub-codes 308*a*, 308*b*, 308*c* and 308*d*. More specifically, if a sub-code has a value of 1 (binary 001), then the density code is 1/4th. which can be 0001, 0010, 0100 or 1000. If a sub-code has a value of 2, then the density is 2/4th, which can be 0011, 1100, 1010 or 0101. As a second alternative, the density of 2/4th required when the sub-code value is 2 can be provided using the following set of four density codes: 0110, 1001, 1010, or 0101. As a third alternative, the density of 2/4th required when the sub-code value is 2 can be provided using the following set of four density codes: 0110, 1001, 0011, 1100. Any one of these three sets of 4 density codes may be used to provide a density of ¾th when the sub-code value is 2. If a sub-code has a value of 3, then the density is ¾th, which can be 0111, 1011, 1101 or 1110. In each of these cases, the selection of one of the four density codes is based on previous density codes output when a specific sub-code was received by a specific shuffler 310, and based on a pseudo random dither code. If a sub-code has a value of 4 (binary 100), then the density code is 4/4th (i.e., 1), which can only be 1111. Similarly, if a sub-code has a value of 0 (binary 000), then the density is 0/4th (i.e., 0), which can only be 0000.

Continuing with the example where input code 304 has a value of 10, assume sub-codes 308a and 308b each have a value of 3 (binary 011) and sub-codes 308c and 308d each have a value of 2 (binary 010). In this example, shufflers 310a and 310b will output respective shuffled density codes 311a and 311b, each having a density of ¾th. Shufflers 310c and 310d will output respectively shuffled density codes 311c and 311d, each having a density of ⅔th. This will cause ten (10) of the sixteen (16) unit elements (shown as triangles in FIG. 3) to be turned ON, thereby generating an analog output 314 representative of digital input 304.

The specific density code selected by each of shufflers 310a, 310b, 310c and 310d is based on previous density codes output when a specific shuffler previously received the sub-code now being received, and based on a pseudo random dither code. Thus, the specific ten (10) of the sixteen (16) unit elements turned ON each time code 304 has a value of 10 is in a pseudo random pattern such that all possible variations of 10 elements out of the 16 elements have been used and, on average, all possible variations occur a substantially equal number of times.

V. Second Embodiment of Mismatch Shaping Network

A second embodiment of mismatch shaping network 302 will now be described with reference to FIG. 13. In contrast to the above discussed embodiments of code splitter and code shuffle-306 shown in FIGS. 5 and 11, the code splitter and code shuffler 306 of FIG. 13 includes only one shuffler (i.e., shuffler 1310), as opposed to four shufflers (i.e., shufflers 502a, 502b, 502c and 502d, or shufflers 1102a, 1102b, 1102c and 1102d). It will be appreciated from the following description that the mismatch shaping network 302 of FIG. 13 can therefore be implemented using fewer logic gates than the previously described embodiments.

A. High Level Overview of Second Embodiment

In this embodiment, a truncation block 1302 produces a truncation output 1304 based on digital input signal 304. Truncation output 1304 is equal to the greatest integer less than X÷K, where K represents the number of multi-bit sub-DACs 312 (K is preferably greater than two) and X represents the value of digital input 304. In the exemplary embodiment shown in FIG. 13, K equals four (i.e., K=4). Thus, truncation output 1304 is equal to the greatest integer less than the value of the digital input signal 304 (i.e., X) divided by four (i.e., K). Truncation block 1302 is an implementation of range selector 402.

Digital input signal 304 is also provided to a modulo block 1306, which produces a modulo signal 1308. Modulo block 1306 performs a modulo function (i.e., x modulo K), which is equal to x minus the product of K times the next integer smaller than x divided by K (unless x divided by K is an integer, in that case x modulo K equals zero). Thus, in the exemplary embodiment shown in FIG. 13, modulo signal 1308 is equal to the value of digital input signal 304 (i.e., X) modulo four (i.e., K). Modulo signal 1308 is an implementation of modulo signal 408.

Modulo signal 1308 is provided to a K-term shuffler 1310. In the exemplary embodiment shown in FIG. 13, shuffler 1310 is a shuffler (i.e., K=4). Shuffler 1310 outputs a K-bit shuffled density code 1311. In the exemplary embodiment, density code 1311 is a four-bit density code, which is also referred to as z<3:0>. For a given value of modulo signal 1308, shuffler 1310 produces patterns of the possible density codes, preferably in a pseudo random fashion, such that each density code occurs approximately the same number of times. For example, if modulo signal 1310 repeatedly has a value of one, then shuffler 1310 should produce a pattern of all possible variations of a ¼th density code signal: 0001, 0010, 0100 and 1000. The next four times modulo signal 1310 equals one, shuffler 1310 preferably produces patterns of the possible variations in a different order. Shuffler 1310 is an implementation of density generator 404.

Figure 13:
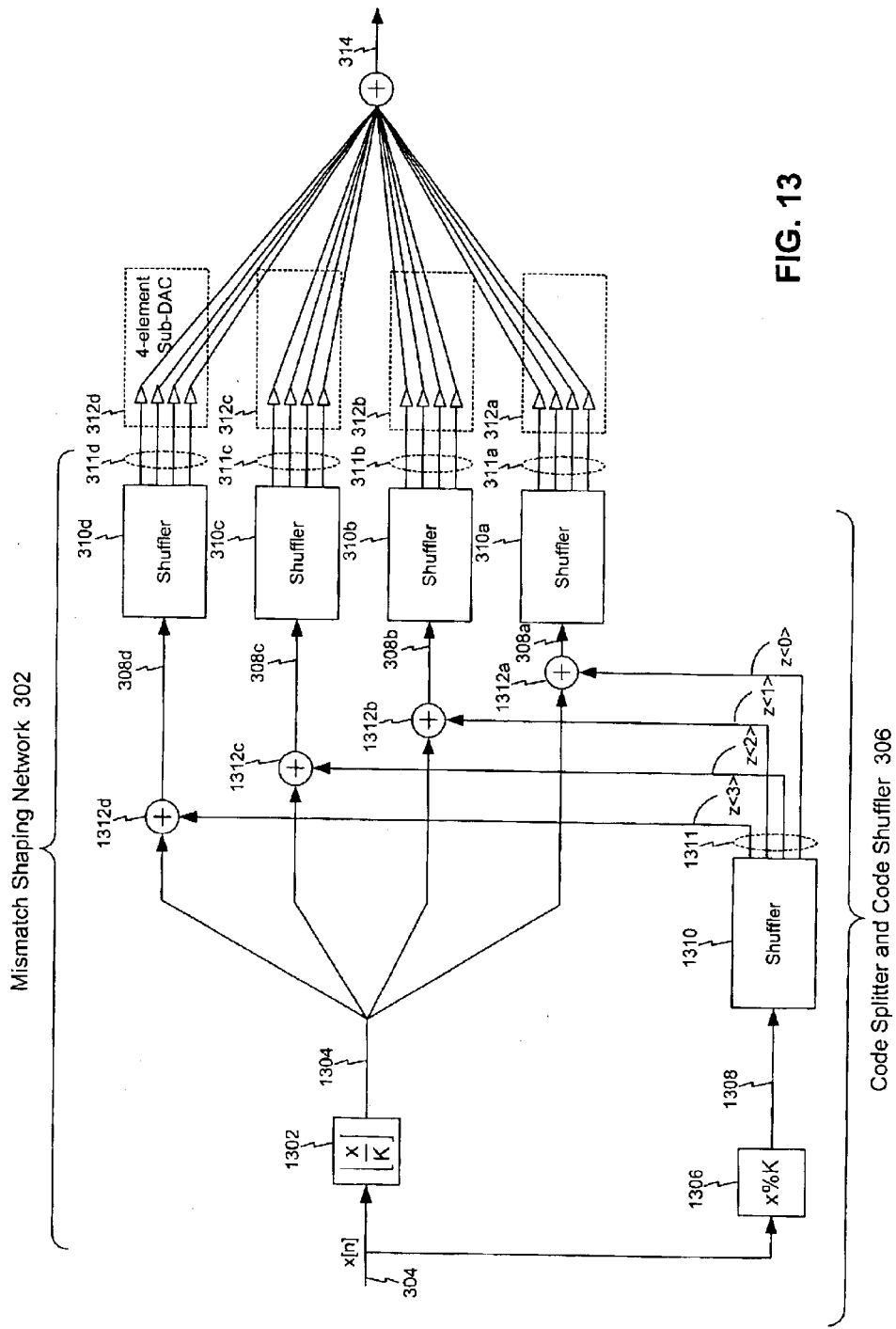
FIG. 13 is a block diagram of showing an alternative embodiment of a mismatch shaping network.

Each bit of K-bit shuffled density code 1311 is separately added to truncation output 1304, to produce sub-codes 308. In the exemplary embodiment of FIG. 13 (i.e., where K=4), bit z<0> (of density code 1311) and truncation output 1304 are added by adder 1312a to produce first sub-code 308a. First sub-code 308a is provided to a K term shuffler, illustrated here as shuffler 310a. Similarly, bit z<1> (of density code 1311) and truncation output 1304 are added by adder 1312b to produce second sub-code 308b. Second sub-code 308b is provided to shuffler 311b. Similarly, bit z<2> (of density code 1311) and truncation output 1304 are added by adder 1312c to produce third sub-code 308c. Third sub-code 308c is provided to shuffler 310c. Similarly, bit z<3> (of density code 1311) and truncation output 1304 are added by adder 1312c to produce fourth sub-code 308d. Fourth sub-code 308d is provided to shuffler 310d. Adders 1312a, 1312b, 1312c and 1312d are an implementation of combiner 406.

Where K=4, as in the exemplary embodiment of FIG. 13, the shufflers 310a, 310b, 310c and 310d used in this mismatch shaping network embodiment can be implemented using the embodiment of a shuffler described in detail above with reference to FIG. 10.

A first implementation of the third embodiment of the mismatch shaping network 302 will be described with reference to FIG. 14. In the first implementation of FIG. 14, digital input signal 304 is a sixteen (16) level input signal that can be equal to binary 0000 (decimal 0) through binary 1111 (decimal 16). In a second implementation, described with reference to FIG. 15, digital input signal 304 is a seventeen (17) level input signal that can be equal to binary 00000 (decimal 0) through binary 10000 (decimal 17).

B. First Implementation

Figure 14:
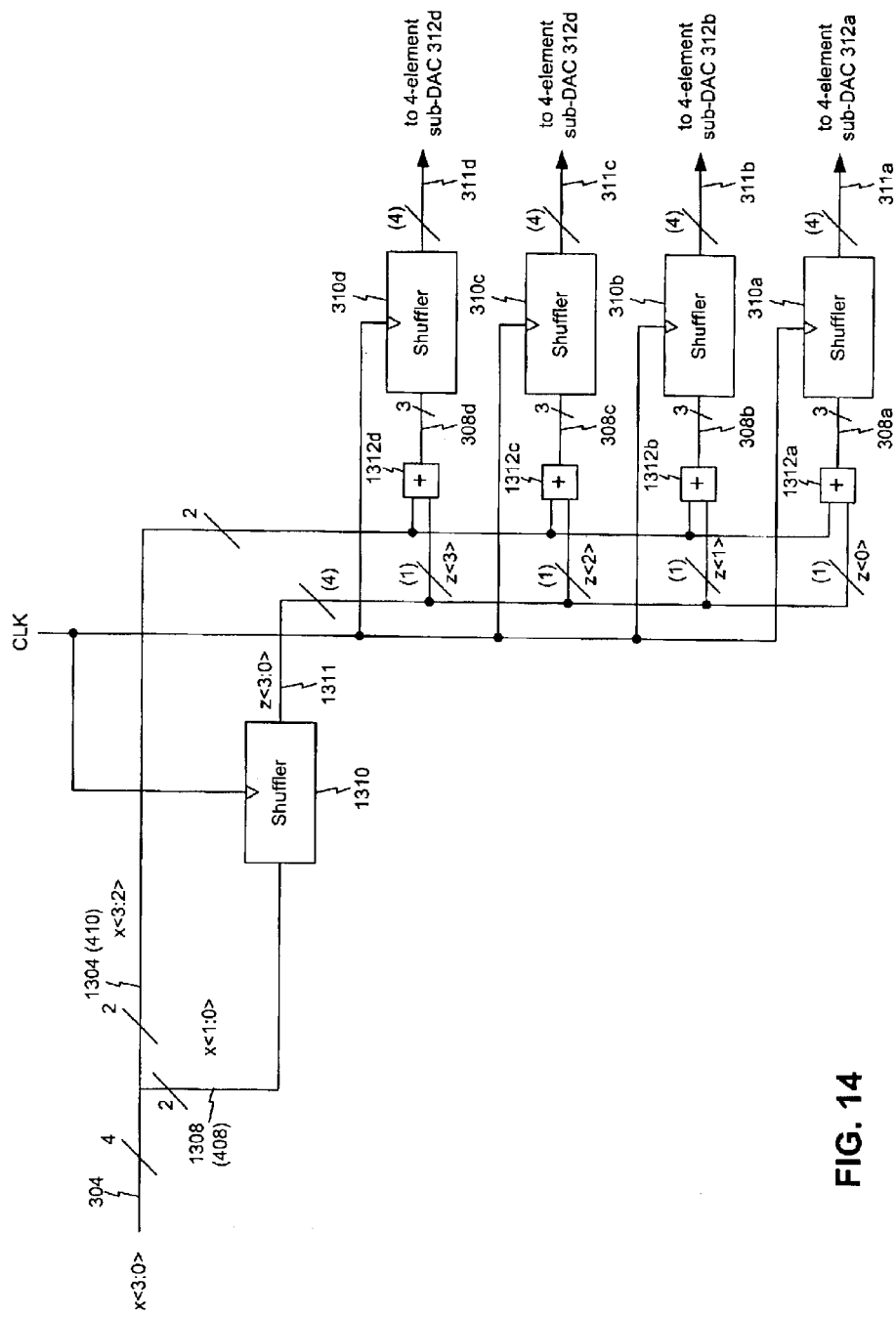
FIG. 14 is a block diagram illustrating a first implementation of the mismatch shaping network of FIG. 13.

Referring to FIG. 14, digital input signal 304 (also referred to as x<3:0>) is a sixteen (16) level input signal that can be equal to binary 0000 (decimal 0) through binary 1111 (decimal 16), as just mentioned above.

In this embodiment, the function of truncation block 1302 is accomplished by simply taking the two MSBs (i.e., x<3:2>) of digital input signal 304 to produce range signal 1304. As mentioned above, range signal 1304 is an implementation of range signal 410.

Similarly, the function of modulo block 1306 is accomplished simply by taking the two LSBs (i.e., x<1:0>) of digital input signal 304 to produce modulo signal 1308. As mentioned above, modulo signal 1308 is an implementation of modulo signal 408.

Modulo signal 1308 is provided to a shuffler 1310, which outputs a 4-bit shuffled density code 1311 (also referred to as z<3:0>). As mentioned above, for a given value of modulo signal 1308, shuffler 1310 produces patterns of the possible density codes, preferably in a pseudo random fashion, such that each density code occurs approximately the same number of times. Shuffler 1310 can be implemented using the shuffler described above in detail with reference to FIG. 6.

Each bit of 4-bit shuffled density code 1311 (i.e., z<3:0>) is separately added to truncation output 1304 (i.e., x<3:2>), to produce sub-codes 308*a*, 308*b*, 308*c* and 308*d*. More specifically, bit z<0> (of density code 1311) and truncation output 1304 are added by adder 1312*a* to produce first sub-code 308*a*. First sub-code 308*a* is provided to shuffler 310*a*. Similarly, bit z<1> (of density code 1311) and truncation output 1304 are added by adder 1312*b* to produce second sub-code 308*b*. Second sub-code 308*b* is provided to shuffler 310*b*. Similarly, bit z<2> (of density code 1311) and truncation output 1304 are added by adder 1312*c* to produce third sub-code 308*c*. Third sub-code 308*c* is provided to shuffler 310*c*. Similarly, bit z<3> (of density code 1311) and truncation output 1304 are added by adder 1312*d* to produce fourth sub-code 308*d*. Fourth sub-code 308*d* is provided to shuffler 310*d*. The sum of the four sub-codes 308*a*, 308*b*, 308*c* and 308*d* equals digital input code 304. Adders 1312*a*, 1312*b*, 1312*c* and 1312*d* are an implementation of combiner 406. Adders 1312*a*, 1312*b*, 1312*c* and 1312*d* can be implemented, for example, using the adder shown in FIG. 12.

In this embodiment, shuffler 1310 is used in place of four shufflers (502*a*, 502*b*, 502*c* and 502*d* or 1102*a*, 1102*b*, 1102*c* and 1102*d*) used in the previous embodiments to effectively cycle through the various sub-code combinations to average the error of each multi-element sub-DAC 312*a*, 312*b*, 312*c* and 312*d*. Each of shufflers 310*a*, 310*b*, 310*c* and 310*d* perform mismatch shapes for one of the multi-element sub-DACs 312*a*, 312*b*, 312*c* and 312*d*. As mentioned above, the shufflers 310*a*, 310*b*, 310*c* and 310*d* can be implemented using the embodiment of a shuffler described in detail above with reference to FIG. 10. Shuffler 1310 can be implemented using the embodiment of a shuffler described in detail above with reference to FIG. 6. If the shuffler described with reference to FIG. 6 is used to implement shuffer 1310 then the EN signal in FIG. 6 should be connected to a HIGH level so the this shuffler is always enabled.

Shufflers 310*a*., 310*b*, 310*c*, 310*d*, and 1310 may also be implemented using many different dynamic element matching (DEM) structures, and should not be limited to the specific implementations of FIG. 6 and FIG. 10. For example, any of the dynamic element matching structures described in the patents and papers that have been incorporated by reference above, may be used to implement shuffler 1310. One of ordinary skill in the art will appreciate how any of these DEM structures may be used to implement Shuffler 310*am* 310*b*, 310*c*, 310*d*, and 1310.

As will be appreciated by one of ordinary skill in the art, embodiments of the present invention allows small DEM circuits of low-complexity (that can only, by themselves, be used with very small DACs) to be used in DACs with very large numbers of elements. The additional complexity added for this capability is small.

C. Second Implementation

Figure 15:
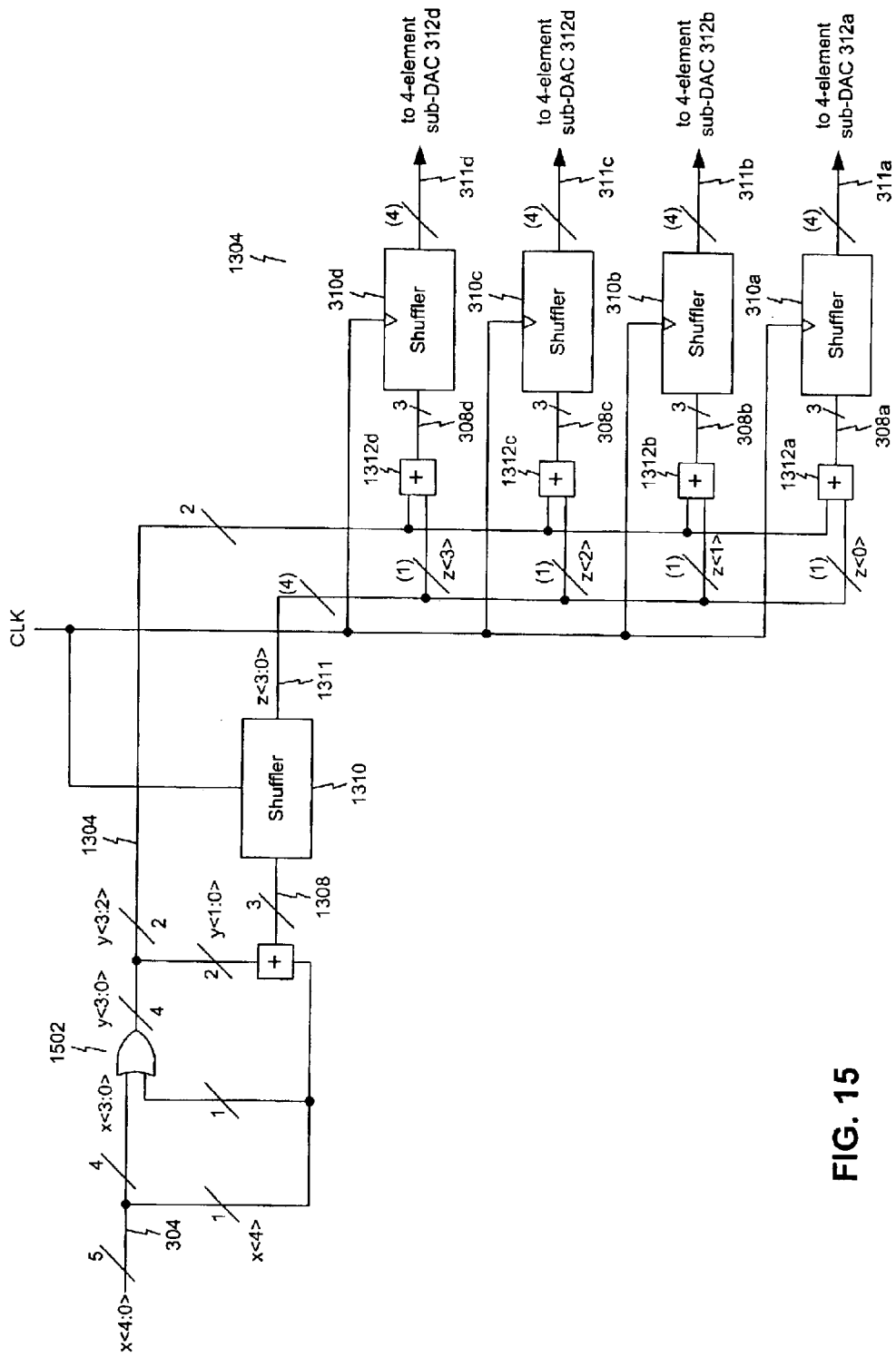
FIG. 15 is a block diagram illustrating a second implementation of the mismatch shaping network of FIG. 13.

Referring now to FIG. 15, digital input signal 304 is a seventeen (17) level input signal that can be equal to binary 00000 (decimal 0) through binary 10000 (decimal 17). This second embodiment, although very similar to the first embodiment, is slightly more complex because the 17$^{th}$ level (i.e., binary 10000) is a special case that must be dealt with.

In this embodiment, the truncation function of truncation block 1302 is accomplished by OR-ing x<4> (the MSB of digital input signal 304) with x<3:0>. This will cause the output (y<3:0>) of OR gate 1502 (which is actually four OR gates) to be equal to x<3:0> in every instance except when digital input signal 304 has a binary value 10000 (decimal value 17), i.e., when x<4> equals bit 1. When x<4> equals bit 1, then output y<3:0> will equal 1111. The two MSBs of y<3:0> (i.e., y<3:2>) are taken to produce range signal 1304. As mentioned above, range signal 1304 is an implementation of range signal 410.

Similarly, the function of modulo block 1306 is accomplished by adding x<4> and the two LSBs of y<3:0> (i.e., y<1:0>) to produce modulo signal 1308. Modulo signal 1308 will be equal to x<1:0> in every instance except when digital input signal 304 has a binary value 10000 (decimal 17), i.e., when x<4> equals binary bit 1. When x<4> equals binary bit 1, y<1:0> will equal binary bits 11, the sum of which is binary bits 100. Thus, when x<4> equals binary bit 1, modulo signal 1308 equals binary bits 100 (decimal 4). As mentioned above, modulo signal 1308 is an implementation of modulo signal 408.

Shuffler 1310 can be implemented using the shuffler described above in detail with reference to FIG. 6. Shuffler 1310 may also be implemented using any known dynamic element matching (DEM) structure, such as those described in the patents that have been incorporated by reference above. One of ordinary skill in the art will appreciate how any of these DEM structures may be used to implement Shuffler 1310.

Referring to the exemplary implementation of FIG. 6 and its corresponding discussion, when the input to shuffler 1310 is binary 100 (i.e., decimal 4), the density code output (i.e., density signal 1311, in this embodiment) is density code 1111.

In the same matter described above, each bit of 4-bit shuffled density code 1311 (i.e., z<3:0>) is separately added to truncation output 1304 (i.e., x<3:2>), to produce sub-codes 308*a*, 308*b*, 308*c* and 308*d*. Sub-codes 308*a*, 308*b*, 308*c* and 308*d* are provided to respective shufflers 310*a*, 310*b*, 310*c* and 310*d*. Each of shufflers 310*a*, 310*b*, 310*c* and 310*d* perform mismatch shapes for one of the multi-element sub-DACs. As mentioned above, the shufflers 310*a*, 310*b*, 310*c* and 310*d* can be implemented using the embodiment of a shuffler described in detail above with reference to FIG. 10, or other known DEM structures.

D. Variations on Second Embodiment

In the above described implementations of the second embodiment of mismatch shaping network 302, shuffle-1310 is used to move the effects of errors produced by the multi-element sub-DACs to out of band frequencies. As mentioned above, shuffler 1310 can be implemented using the shuffler described above in detail with reference to FIG. 6. Alternatively, any dynamic element matching (DEM) algorithm known in the art (and its corresponding implementation) can be used in place of shuffler 1310 to spectrally shape the gain mismatch errors. Referring to FIG. 13, for example, if the multi-bit DAC 300 is constructed from of K multi-element sub-DACs 312, any K-element DEM encoder can be used in place of shuffler 1310.

VI. Flow Diagrams

Figure 16:
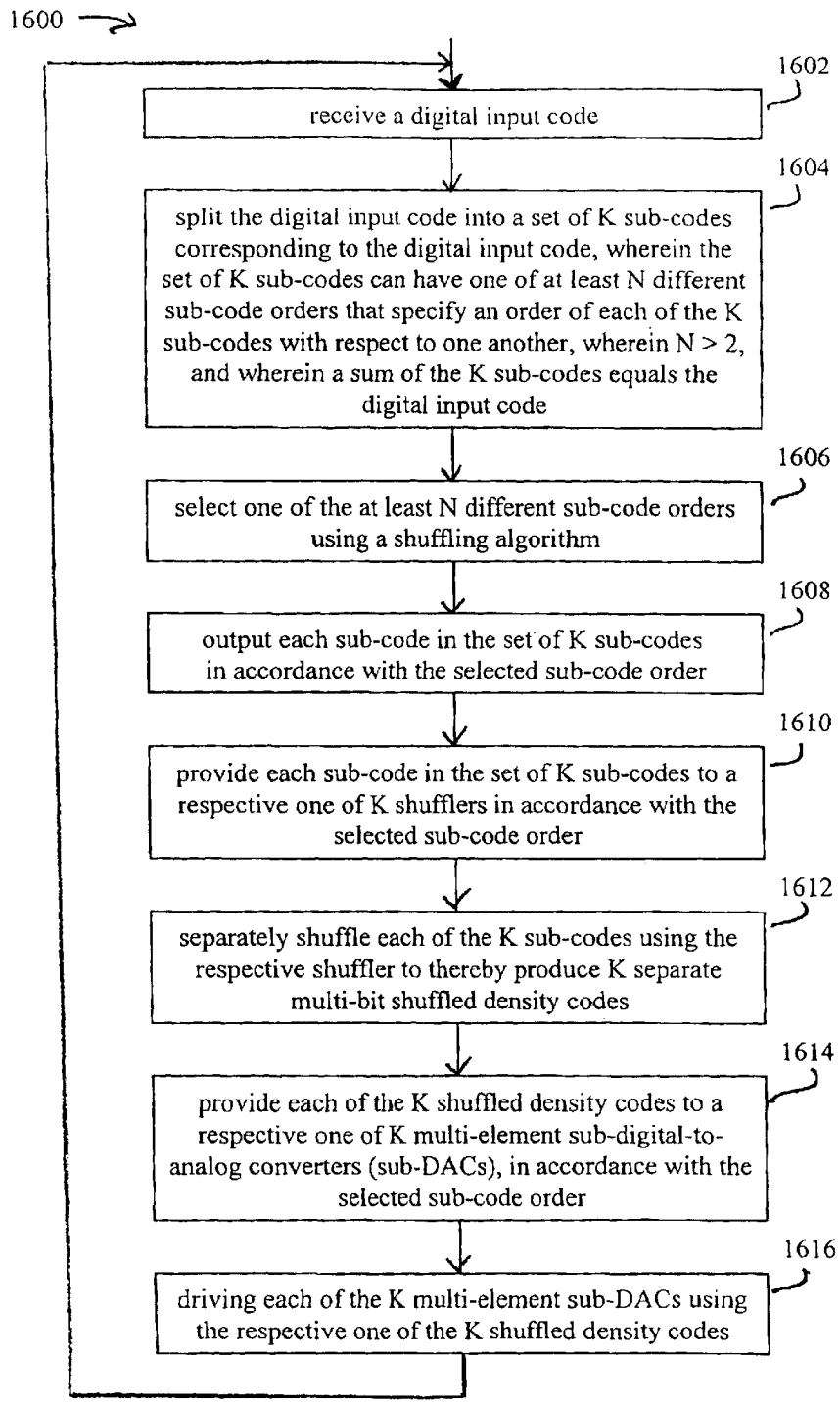
FIGS. 16–18 are flow diagrams illustrating methods of the present invention.
Figure 17:
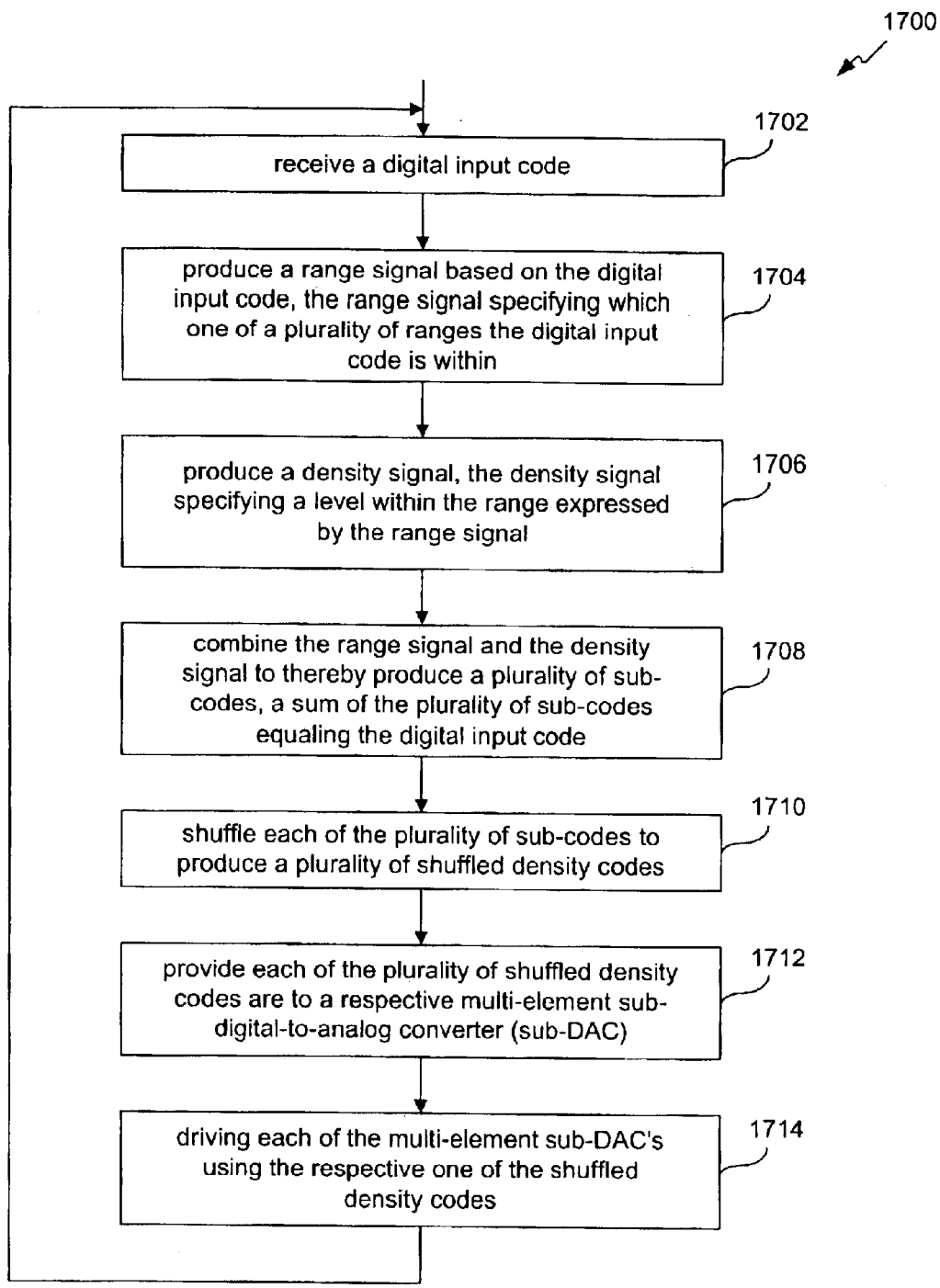
Figure 18:
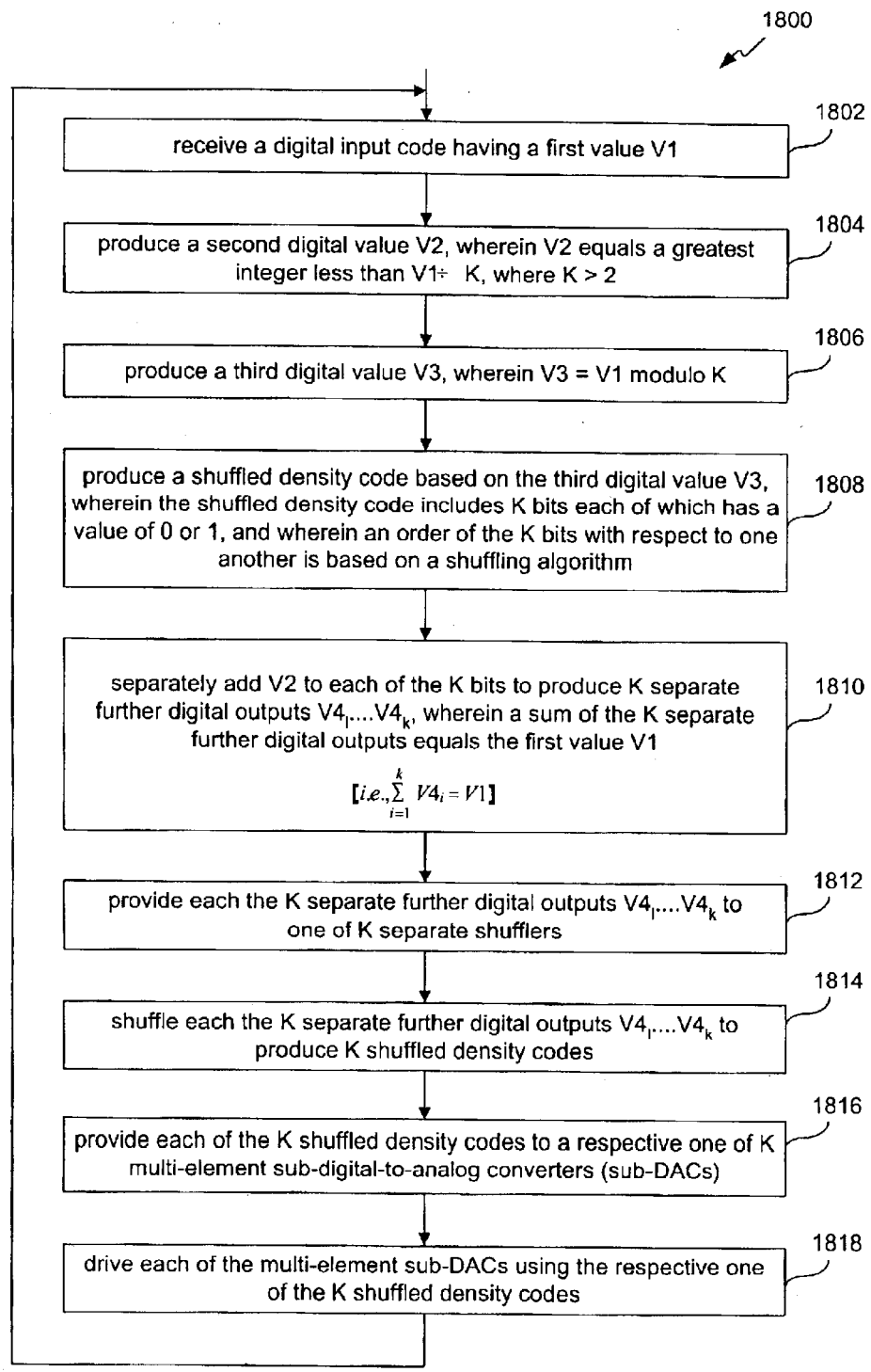

FIGS. 16, 17 and 18 are flow diagrams that are useful for describing an overview of the operation of embodiments of the present invention. More specifically, FIGS. 16, 17 and 18 are useful for describing methods of mismatch shaping according to embodiments of the present invention.

Referring first to FIG. 16, a method 1600 of the present invention starts when a digital input code (e.g., of signal 304) is received at a step 1602.

At a next step 1604, the digital input code is split into a set of K sub-codes corresponding to the digital input code.

The set of K sub-codes can have one of at least N different sub-code orders that specify an order of each of the K sub-codes with respect to one another, wherein N>2. A sum of the K sub-codes equals the digital input code received at step 1602. In a preferred embodiment, each of the K sub-codes is not different than any of the other K-1 sub-codes within the set of K sub-codes by more than one level.

At a next step 1606, one of the at least N different sub-code orders is selected using a shuffling algorithm. The shuffling algorithm can be a dynamic element mismatch shaping algorithm, as discussed above. In an embodiment discussed in more detail above, the selecting of the one of the at least N different sub-code orders is based on: (1) one or more sub-code orders that were previously selected, and/or (2) a pseudo random code. Steps 1604 and 1606 may occur simultaneously, and thus, may be combined into one step.

At a step 1608, each sub-code in the set of K sub-codes is output in accordance with the selected sub-code order. In one embodiment, each of the K sub-codes is provided directly to one of K sub-DACs that convert the sub-codes to analog signals without any additional shuffling. However, preferably, at a step 1610 (which can be combined with step 1608), each sub-code in the set of K sub-codes is provided to a respective one of K shufflers in accordance with the selected sub-code order. Then, at a step 1612, each of the K sub-codes are separately shuffled using the respective one of the K shufflers to thereby produce K separate multi-bit shuffled density codes. At a step 1614, each of the K shuffled density codes are provided to a respective one of K multi-element sub-digital-to-analog converters (sub-DACs), in accordance with the selected sub-code order. At a step 1616, each of the K multi-element sub-DACs are driven using the respective one of the K shuffled density codes. Each of the K multi-element sub-DACs produce analog outputs, which are combined (e.g., added) to produce an analog signal that is representative of the digital signal received at step 1602.

The above steps can be thought of as a method for mismatch shaping, according to an embodiment of the present invention. As can be understood from the descriptions above, method 1600 can be used to spectrally shape gain mismatch errors in a multi-bit DAC constructed from K separate multi-element sub-DACs. More specifically, each of the K shuffled density codes can be provided to a respective one of the K sub-DACs. Each of the sub-DACs converts its respective received multi-level sub-codes into multiple analog signals. All of the analog signals output from the K sub-DACs are then combined to produce an analog signal (i.e., the output of the multi-bit DAC) representative of the digital input code. These steps are repeated for each digital input code of a digital input signal. In this manner, a digital input signal is converted to an analog signal in such a way that mismatch errors, due to mismatch of the elements, are moved to out of band frequencies.

Additional details and variations of method 1600 can be appreciated from the various embodiments described above.

Referring now to FIG. 17, this embodiment of the present invention starts when a digital input code is received, at a step 1702. As mentioned above, the digital input code can be received, for example, from a digital sigma-delta modulator, or from a multi-bit analog-to-digital converted of an analog sigma-delta modulator.

At a step 1704, a range signal is produced based on the digital input code. The range signal specifies which one of a plurality of ranges the digital input code is within.

At a step 1706, a density code is produced. The density code specifies a level within the range expressed by the range signal. The density signal can be produced based on the digital input code (e.g., based on a portion of digital input code). In another embodiment, a modulo signal (that specifies a difference between the digital input code and a lower end of the range specified by the range signal) is produced. The density signal can then be produced based on the modulo signal. Preferably, step 1706 includes selecting one of a plurality of orders for the density code using a shuffling algorithm. Each of the orders specify an order of bits in the density code. This shuffling algorithm can be a dynamic element mismatch shaping algorithm, many of which were discussed above. In an embodiment of the present invention, the one of the plurality of orders for the density code can be selected based on at least one of: (1) one or more orders that were previously selected, and/or (2) a pseudo random code. The order is preferably selected such that, as these steps are repeated, on average, each one of the different orders is selected substantially the same number of times.

At a step 1708, the range signal and the density signal are combined to thereby produce a plurality of sub-codes. A sum of the plurality of sub-codes equals the digital input code. In one embodiment, each of the plurality of sub-codes is provided directly to one of a plurality of sub-DACs that convert the sub-codes to analog signals without any additional shuffling. However, preferably, at a step 1710, each of the plurality of sub- codes are shuffled to produce a plurality of shuffled sub- density codes. Then, at a step 1712, each of the plurality of shuffled seb density codes are provided to a respective multi-element sub-digital-to-analog converter (sub-DAC). At a step 1714, each of the multi-element sub-DACs are driven using the respective one of the shuffled sub- density codes. Each of the multi-element sub-DACs produce analog outputs, which are combined (e.g., added) to produce an analog signal that is representative of the digital signal received at step 1702.

Steps of method 1700 can be though thought of a method for niismatch shaping, according to an embodiment of the present invention. As can be understood from the descriptions above, method 1700 can be used to spectrally shape gain mismatch errors in a multi-bit DAC constructed from a plurality of separate multi-element sub-DACs. More specifically, each of the shuffled sub-codes can be provided to a respective one of a plurality of sub-DACs. Each of the sub-DACs converts its respective received sub-code into multiple analog signals. All of the analog signals output from the plurality of sub-DACs are then combined to produce an analog signal (i.e., the output of the multi-bit DAC) representative of the digital input code. These steps are repeated for each digital input code of a digital input signal. In this manner, a digital input signal is converted to an analog signal in such a way that mismatch errors, due to mismatch of the elements, are moved to out of band frequencies. Additional details and variations of method 1700 can be appreciated from the various embodiments described above.

Referring now to FIG. 18, an embodiment of the present invention starts when multi-level digital input code having a first value V1, is received at a step 1802.

At a step 1804, a second digital value V2 is produced, wherein V2 equals a greatest integer less than V1÷K, where K>2.

At a step 1806, a third digital value V3 is produced, wherein V3 equals a V1 modulo K.

At a next step 1808, a shuffled density code is produced based on the third digital value V3. The shuffled density code includes K bits each of which has a value of 0 or 1. An order of the K bits with respect to one another is based on a shuffling algorithm. Exemplary algorithms and corresponding implementations have been discussed above.

At a step 1810, V2 is added to each of the K bits to produce K separate further digital outputs $V4_1 \ldots V4_K$. A sum of the K separate further digital outputs equals the first value $$V1 \left[ i.e., \sum_{i=1}^{k} V4_i = V1 \right].$$

At a next step 1812, each the K separate further digital outputs $V4_1 \ldots V4_K$ is provided to one of K separate shufflers.

At a next step 1814, each the K separate further digital outputs $V4_1 \ldots V4_K$ is shuffled to produce K shuffled sub-density codes.

At a step 1816, each of the K shuffled density codes is provided to a respective one of K multi-element sub-digital-to-analog converters (sub-DACs).

At a step 1818, each of the multi-element sub-DACs are driven using the respective one of the shuffled sub-density codes. Each of the multi-element sub-DACs thereby produce analog outputs, which are combined (e.g., added) to produce an analog output signal that is representative of the digital signal received at step 1802.

Similarly, the steps of method 1800 can be thought of as a method for mismatch shaping, according to an embodiment of the present invention. As can be understood from the descriptions above, method 1800 can be used to spectrally shape gain mismatch errors in a multi-bit DAC constructed from K separate multi-element sub- DACs. More specifically, each of the shuffled density codes can be provided to a respective one of K sub-DACs. Each of the K sub-DACs converts its respective received density code into multiple analog signals. All of the analog signals output from the K sub-DACs are then combined to produce an analog signal (i.e., the output of the multi-bit DAC) representative of the digital input code. Steps of method 1800 are repeated for each digital input code of a digital input signal. In this manner, a digital input signal is converted to an analog signal in such a way that mismatch errors, due to mismatch of the elements, are moved to out of band frequencies. Additional details of method 1800 can be appreciated from the various embodiments described above, especially the embodiments discussed in connection with FIGS. 13, 14 and 15.

VII. CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention. For example, many of the above described exemplary embodiments of the mismatch shaping network of the present invention are shown as splitting a digital input code into four sub-codes, which are each provided to one of four separate shufflers. However, one of ordinary skill in the art will appreciate from the above description that a digital input code can be split into a different number of sub-codes (i.e., other than four) while still being within the spirit and scope of the present invention. Additionally, one of ordinary skill in the art will appreciate from the above description that each of the shufflers can shuffle more or fewer than four terms as appropriate.

The present invention has been described above with the aid of functional building blocks and flow diagrams illustrating the performance of specified functions and relationships thereof. The boundaries of these functional building blocks and the steps of flow diagrams have often been arbitrarily defined herein for the convenience of the description. Alternate boundaries can be defined so long as the specified functions and relationships thereof are appropriately performed. Any such alternate boundaries are thus within the scope and spirit of the claimed invention. For example, the function of code splitter and code shuffler 306 can be separate into two functional blocks where the splitting occurs first and then the shuffling occurs second. This separating of these functions is also intended to be covered by the present invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A system for mismatch shaping, comprising:
   means for receiving a digital input code;
   means for producing a range signal based on the digital input code, the range signal specifying one of a plurality of ranges the digital input code is within;
   means for producing a density code, the density code specifying a level within the range expressed by the range signal; and
   means for combining the range signal and the density code to thereby produce a plurality of sub-codes, a sum of the plurality of sub-codes equaling the digital input code.

2. The system of claim 1, wherein the means for producing the density code selects one of a plurality of orders for the density code using a shuffling algorithm, wherein each of the orders specify an order of bits in the density code.

3. The system of claim 2, wherein the shuffling algorithm comprises a dynamic element mismatch shaping algorithm, and wherein the means for producing the density code selects the one of the plurality of orders for the density code using the dynamic element mismatch shaping algorithm.

4. The system of claim 2, wherein the means for producing the density code selects the one of the plurality of orders for the density code based on at least one of:
   one or more sub-code orders that were previously selected, and
   a pseudo random code.

5. The system of claim 1, further comprising:
   means for shuffling each of the plurality of sub-codes to produce a plurality of shuffled density codes.

6. The of claim 5, wherein the means for shuffling provide each of the plurality of shuffled density codes to a respective multi-element sub-digital-to-analog converter (sub-DAC).

7. The system of claim 1, wherein the means for producing the range signal produces the range signal based on a portion of the digital input code.

8. The system of claim 1, wherein the digital input code comprises a multi-bit binary word, and wherein the means for producing the range signal comprises producing the range signal based on at least two most significant bits of the binary word.

9. The system of claim 1, wherein the means for producing the density code produces the density code based on a portion of the digital input code.

10. The system of claim 1, wherein the digital input code comprises a multi-bit binary word, and wherein the means for producing the density code produces the density code based on at least two least significant bits of the binary word.

11. The system of claim 1, wherein the means for producing the density code produces a modulo signal specifying a difference between the digital input code and a lower end of the range specified by the range signal and produces the density code based on the modulo signal.

12. The system of claim 1, wherein:

the density code is comprised of K bits, wherein K<1; and the means for combining separately adds each of the K bits to the range signal to thereby produce K separate sub-codes, the K separate sub-codes being the plurality of sub-codes.

13. The system of claim 12, further comprising:

means for shuffling each of the K sub-codes to produce K shuffled density codes; and means for providing each of the K shuffled density codes to a respective multi-element sub-digital-to-analog converter (sub-DAC).

14. The system of claim 1, wherein:

bits of the density code have one of a plurality of different orders for a specific digital input code; and the means for producing the density codes selects one of the different orders such that, on average, each one of the different orders is selected substantially the same number of times.

15. A system for mismatch shaping, comprising:

means for receiving a digital input code having a first value V1;

means for producing a second digital value V2, wherein V2 equals a greatest integer less than V1.div.K, where K<2;

means for producing a third digital value V3, wherein V3 equals V1 modulo K;

means for producing a shuffled density code based on the third digital value V3, wherein the shuffled density code includes K bits each of which has a value of 0 or 1, and wherein an order of the K bits with respect to one another is based on a shuffling algorithm; and means for separately adding V2 to each of the K bits to produce K separate further digital outputs V4.sub.1 . . . V4.sub.K, wherein a sum of the K separate further digital outputs equals the first value.

16. The system of claim 15, wherein the shuffling algorithm comprises a dynamic element mismatch shaping algorithm, and wherein the means for producing the shuffled density code uses the dynamic element mismatch shaping algorithm.

17. The system of claim 15, further comprising:

means for providing each the K separate further digital outputs V4.sub.1 . . . V4.sub.K to one of K separate shufflers; and means for separately shuffling each of the digital outputs V4.sub.1 . . . V4.sub.K using one of the K shufflers to produce a respective shuffled density code to produce K shuffled density codes for each digital input code.

18. The system of claim 17, further comprising:

means for providing each of the K shuffled density codes to a separate one of K multi-bit sub-digital-to-analog converters (sub-DACs); and means for converting each of the K shuffled density codes to analog signals using a respective one of the K multi-bit sub-DACs, thereby producing a plurality of analog signals, wherein a sum of the plurality of analog signals is representative of the first value V1.

19. The system of claim 15, further comprising:

means for separately shuffling each of the digital outputs V4.sub.1 . . . V4.sub.K to produce a respective shuffled density code to produce K shuffled density codes for each digital input code; and means for converting each of the K shuffled density codes to analog signals using a respective one of the K multi-bit sub-DACs to produce a plurality of analog signals, wherein a sum of the plurality of analog signals is representative of the first value V1.

* * * * *

UNITED STATES PATENT AND TRADEMARK OFFICE
CERTIFICATE OF CORRECTION

PATENT NO. : 6,771,199 B2  
DATED : August 3, 2004  
INVENTOR(S) : Todd L. Brooks Page 1 of 1

It is certified that error appears in the above-identified patent and that said Letters Patent is hereby corrected as shown below:

<u>Column 31,</u>  
Line 11, "the density code is comprised of K bits, wherein K<1; and" should be -- the density code is comprised of K bits, wherein K>1; and --.  
Line 35, "K<2;" should read -- K>2; --.

Signed and Sealed this

Thirtieth Day of May, 2006

JON W. DUDAS  
*Director of the United States Patent and Trademark Office*